United States Patent
Hamada et al.

(10) Patent No.: US 10,276,590 B2
(45) Date of Patent: Apr. 30, 2019

(54) METHOD FOR MANUFACTURING A SEMICONDUCTOR DEVICE INCLUDING A VERTICAL CHANNEL BETWEEN STACKED ELECTRODE LAYERS AND AN INSULATING LAYER

(71) Applicant: TOSHIBA MEMORY CORPORATION, Minato-ku (JP)

(72) Inventors: Tatsufumi Hamada, Yokkaichi (JP); Hikari Tajima, Mitaka (JP); Takashi Izumida, Yokohama (JP); Nobutoshi Aoki, Yokohama (JP); Shinya Naito, Toyota (JP); Takayuki Kakegawa, Yokkaichi (JP); Takaya Yamanaka, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/896,173

(22) Filed: Feb. 14, 2018

(65) Prior Publication Data

US 2018/0175056 A1 Jun. 21, 2018

Related U.S. Application Data

(62) Division of application No. 15/264,781, filed on Sep. 14, 2016, now Pat. No. 9,917,099.

(Continued)

(51) Int. Cl.
*H01L 27/11582* (2017.01)
*H01L 23/528* (2006.01)
(Continued)

(52) U.S. Cl.
CPC .... *H01L 27/11582* (2013.01); *H01L 23/5283* (2013.01); *H01L 27/11551* (2013.01); *H01L 29/66833* (2013.01); *H01L 29/792* (2013.01)

(58) Field of Classification Search
CPC .................. H01L 27/11582; H01L 23/5283
See application file for complete search history.

(56) References Cited

U.S. PATENT DOCUMENTS 7,829,948 B2 11/2010 Arai et al.
7,927,953 B2 4/2011 Ozawa
(Continued)

FOREIGN PATENT DOCUMENTS

JP 2008-72051 A 3/2008
JP 2008-159804 A 7/2008
(Continued)

OTHER PUBLICATIONS

Lee, D. N. et al., "Solid-Phase Crystallization of Amorphous Silicon Films." Adv. Top. Cryst. 2015, 15-19, http://dx.doi.org/10.5772/59723 (Year: 2015).*

*Primary Examiner* — Michael Jung
(74) *Attorney, Agent, or Firm* — Oblon, McClelland, Maier & Neustadt, L.L.P.

(57) ABSTRACT

According to one embodiment, a semiconductor device includes a substrate; a stacked body provided on the substrate, the stacked body including a plurality of electrode layers stacked with an insulator interposed; a semiconductor body provided in the stacked body; and an insulating film. The semiconductor body includes a channel portion extending in a stacking direction of the stacked body, and a lower end portion of the semiconductor body provided between the channel portion and the substrate. The insulating film includes a charge storage film provided between the stacked body and the semiconductor body. A lower end portion of the insulating film surrounds the lower end portion of the semiconductor body. An upper surface of the lower end portion of the insulating film is provided at a lower height (Continued)

than an upper surface of the lower end portion of the semiconductor body in the stacking direction.

8 Claims, 25 Drawing Sheets

Related U.S. Application Data

(60) Provisional application No. 62/305,620, filed on Mar. 9, 2016.

(51) Int. Cl.
*H01L 27/11551* (2017.01)
*H01L 29/792* (2006.01)
*H01L 29/66* (2006.01)

(56) References Cited

U.S. PATENT DOCUMENTS

| | | | |
|---|---|---|---|
| 8,278,695 | B2 | 10/2012 | Kidoh et al. |
| 8,450,176 | B2 | 5/2013 | Son et al. |
| 8,455,940 | B2 | 6/2013 | Lee et al. |
| 9,012,971 | B2 | 4/2015 | Seo et al. |
| 2008/0067583 | A1 | 3/2008 | Kidoh et al. |
| 2008/0315291 | A1* | 12/2008 | Kito ............... H01L 27/105 257/324 |
| 2010/0117143 | A1 | 5/2010 | Lee et al. |
| 2011/0073866 | A1 | 3/2011 | Kim et al. |
| 2011/0233648 | A1 | 9/2011 | Seol et al. |
| 2013/0341701 | A1 | 12/2013 | Blomme et al. |
| 2014/0035026 | A1 | 2/2014 | Jang et al. |
| 2014/0252443 | A1* | 9/2014 | Kawai ............... H01L 27/1157 257/314 |
| 2014/0284607 | A1 | 9/2014 | Fukuzumi et al. |
| 2015/0060998 | A1 | 3/2015 | Mizushima et al. |
| 2015/0104916 | A1 | 4/2015 | Lee |
| 2015/0380418 | A1 | 12/2015 | Zhang |
| 2016/0329343 | A1 | 11/2016 | Pachamuthu |
| 2017/0125436 | A1* | 5/2017 | Sharangpani ..... H01L 27/11582 |
| 2017/0287929 | A1* | 10/2017 | Kim ............... H01L 27/11582 |

FOREIGN PATENT DOCUMENTS

| | | |
|---|---|---|
| JP | 2008-171968 | 7/2008 |
| JP | 2010-118659 A | 5/2010 |
| JP | 2010-140997 A | 6/2010 |
| JP | 2011-77521 A | 4/2011 |
| JP | 4768557 B2 | 9/2011 |
| JP | 2011-211200 A | 10/2011 |
| JP | 2011-249803 A | 12/2011 |
| JP | 2013-543266 A | 11/2013 |
| JP | 2014-33201 A | 2/2014 |
| JP | 2014-96466 A | 5/2014 |
| JP | 2014-187246 A | 10/2014 |
| JP | 2015-53336 A | 3/2015 |

* cited by examiner

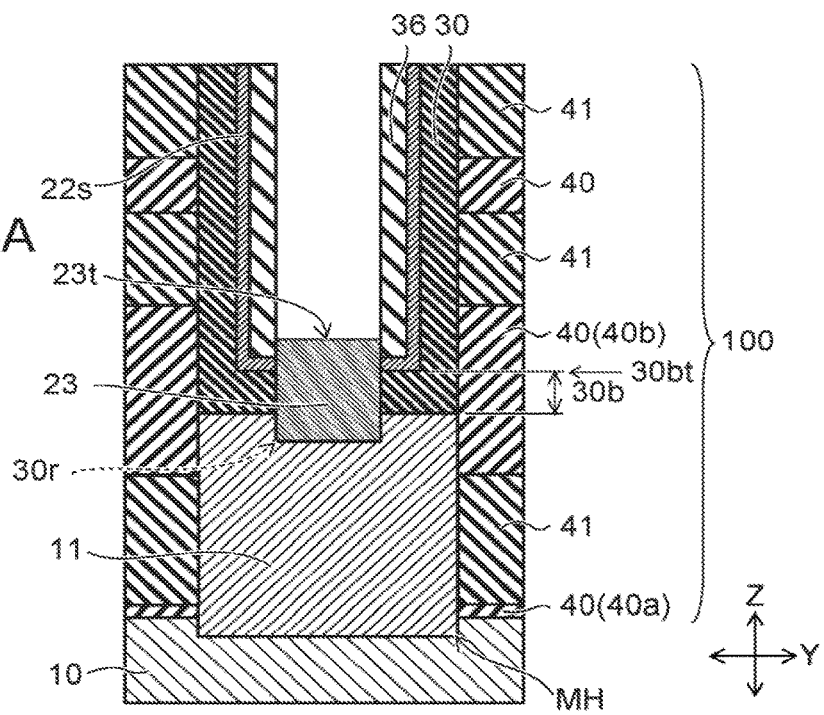
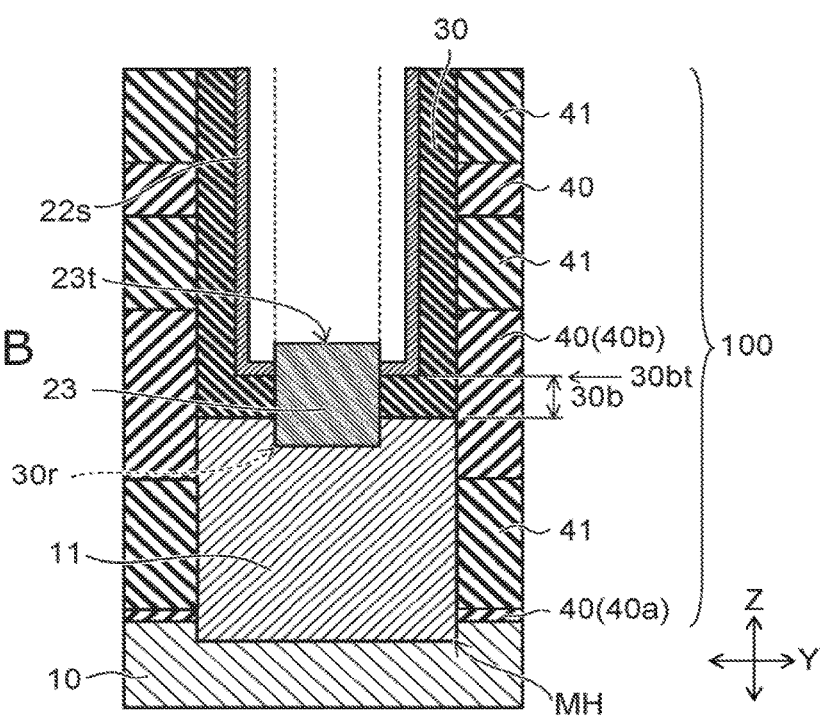

METHOD FOR MANUFACTURING A SEMICONDUCTOR DEVICE INCLUDING A VERTICAL CHANNEL BETWEEN STACKED ELECTRODE LAYERS AND AN INSULATING LAYER

CROSS-REFERENCE TO RELATED APPLICATIONS

This application is a divisional of U.S. application Ser. No. 15/264,781, filed Sep. 14, 2016, now U.S. Pat. No. 9,917,099 which is based upon and claims the benefit of priority from U.S. Provisional Patent Application 62/305,620 filed on Mar. 9, 2016; the entire contents of which are incorporated herein by reference.

FIELD

Embodiments described herein relate generally to a semiconductor device and a method for manufacturing the same.

BACKGROUND

A memory device having a three-dimensional structure has been proposed in which a memory hole is made in a stacked body in which multiple electrode layers are stacked, and a charge storage film and a semiconductor body are provided to extend in a stacking direction of the stacked body inside the memory hole. The memory device includes multiple memory cells connected in series between a drain-side selection transistor and a source-side select transistor. The electrode layers of the stacked body are gate electrodes of the drain-side select transistor, the source-side select transistor, and the memory cell. With the reduction or the increasing the number of stacks of the device, the cell current may be reduced.

BRIEF DESCRIPTION OF THE DRAWINGS

FIG. 13A to FIG. 15B are schematic cross-sectional views showing a method for manufacturing the semiconductor device of the third embodiment;

DETAILED DESCRIPTION

Figure 1:
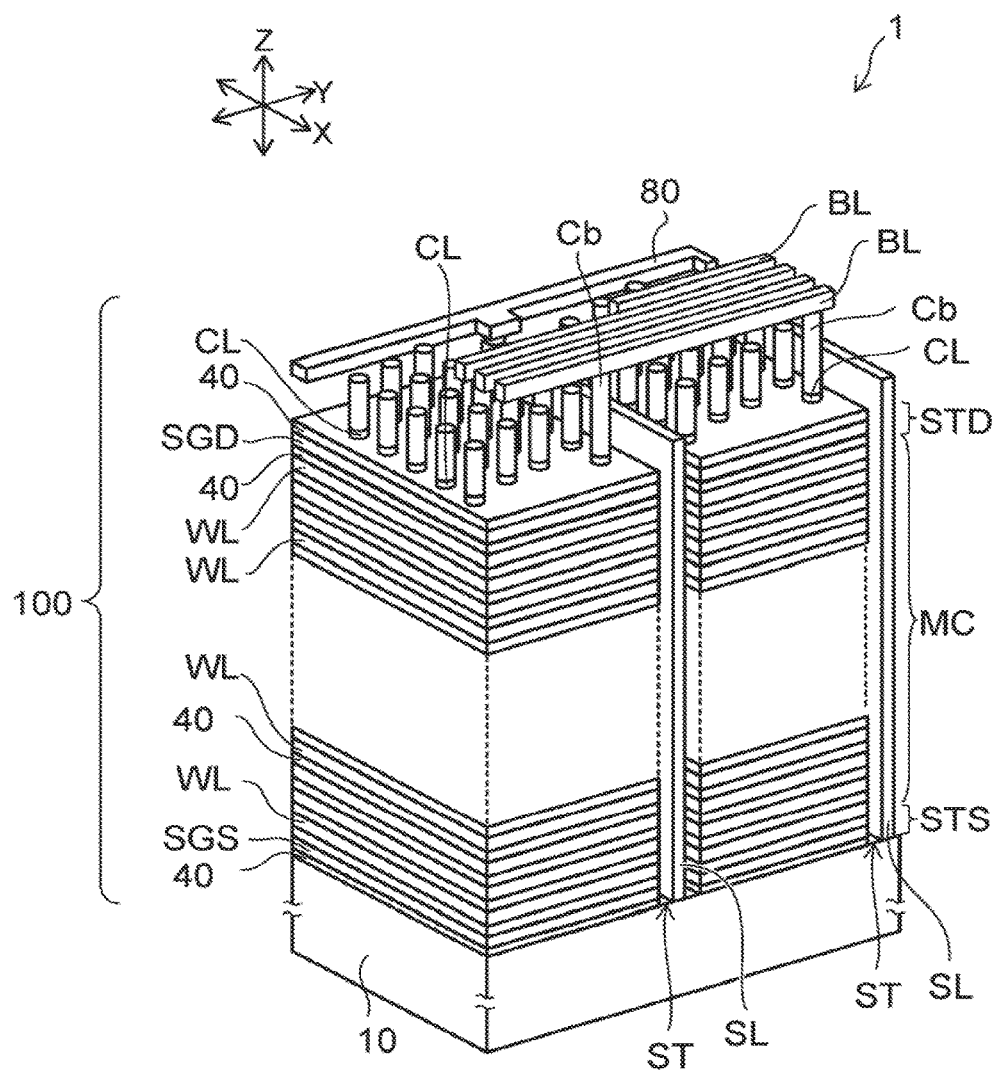
FIG. 1 is a schematic perspective view of a memory cell array of a first embodiment.

According to one embodiment, a semiconductor device includes a substrate; a stacked body provided on the substrate, the stacked body including a plurality of electrode layers stacked with an insulator interposed; a semiconductor body provided in the stacked body; and an insulating film. The semiconductor body includes a channel portion extending in the stacking direction, and a lower end portion of the semiconductor body provided between the channel portion and the substrate. The insulating film includes a charge storage film provided between the stacked body and the semiconductor body and extending in the stacking direction. A lower end portion of the insulating film surrounds the lower end portion of the semiconductor body. An upper surface of the lower end portion of the insulating film is provided at a lower height than an upper surface of the lower end portion of the semiconductor body in the stacking direction.

Embodiments will now be described with reference to the drawings. In the respective drawings, like members are labeled with like reference numerals. Semiconductor devices of the embodiments are semiconductor memory devices having memory cell arrays.

First Embodiment

FIG. 1 is a schematic perspective view of a memory cell array 1 of the first embodiment. In FIG. 1, two mutually-orthogonal directions parallel to a major surface of a substrate are taken as an X-direction and a Y-direction. The XY plane is taken to be a planar direction of a stacked body 100. A direction orthogonal to both the X-direction and the Y-direction is taken as a Z-direction (the stacking direction of the stacked body 100).

As shown in FIG. 1, the semiconductor device of the first embodiment includes the memory cell array 1. The memory cell array 1 is, for example, provided on the major surface of the substrate 10. The substrate 10 is, for example, a semiconductor substrate. The semiconductor substrate includes, for example, silicon and has single crystalline structure. A conductivity type of the substrate 10 is, for example, P-type (first conductivity type).

The memory cell array 1 includes the stacked body 100, a plurality of columnar portions CL, and a plurality of slits ST. The stacked body 100 is provided on the major surface of the substrate 10. The stacked body 100 includes a plurality of electrode layers (SGS, WL, SGD) and a plurality of insulators 40. The plurality of electrode layers (SGS, WL, SGD) is stacked with the insulators 40 interposed. The electrode layer (SGS, WL, SGD) includes a conductive material. The conductive material includes, for example, tungsten. The insulator 40 may be insulating material being silicon oxide and so on, and may include air gap. The number of stacks of electrode layers (SGS, WL, SGD) is arbitrary.

The electrode layer SGS is a source-side select gate line. The electrode layer SGD is drain-side select gate line. The electrode layer WL is a word line. The source-side select gate line SGS is provided on the major surface of the substrate 10 via the insulator 40. A plurality of word lines WL is provided on the source-side select gate line SGS via the insulator 40. The drain-side select gate line SGD is provided on a top layer of the word lines WL via the insulator 40.

At least one of the source-side select gate lines SGS is used as a gate electrode of a source-side select transistor STS. At least one of the drain-side select gate lines SGD is used as a gate electrode of a drain-side select transistor STD. A plurality of memory cells MC is connected in series between the source-side select transistor STS and the drain-side select transistor STD. One of the word lines WL is used as a gate electrode of the memory cell MC.

The slit ST is provided in the stacked body 100. The slit ST extends in the Z-direction and the X-direction. The slit ST separates the stacked body 100 into a plurality of regions in the Y-direction. Each of the regions separated by the slit ST is called "block".

A source line SL is provided in the slit ST. The source line SL includes, for example, at least one of tungsten or titanium. The source line SL may include, for example, a stacked body formed of titanium and titanium nitride. The source line SL is electrically connected to the substrate 10.

An upper layer interconnect 80 is disposed above the source line SL. The upper layer interconnect 80 extends in the Y-direction. The upper layer interconnect 80 is electrically connected to the plurality of source layers SL arranged along the Y-direction. The upper layer interconnect 80 is electrically connected to a peripheral circuit not shown.

The columnar portion CL is provided in the stacked body and extends in the Z-direction. The columnar portion CL is, for example, formed in a circular columnar configuration or an elliptical columnar configuration. The columnar portions CL are disposed, for example, in a staggered lattice configuration or a square lattice configuration in the memory cell array 1. The drain-side select transistor STD, the source-side select transistor STS, and the memory cell MC are disposed at the columnar portion CL.

A plurality of bit lines BL is provided above the columnar portion CL. The plurality of bit lines BL extends in the Y-direction. An upper end portion of the columnar portion CL is electrically connected to one of the bit lines BL via a contact portion Cb. One bit line BL is electrically connected to the columnar portion CL selected from the each block one by one. A lower end portion of the columnar portion CL is electrically connected to the source line SL via the substrate 10.

Figure 2:
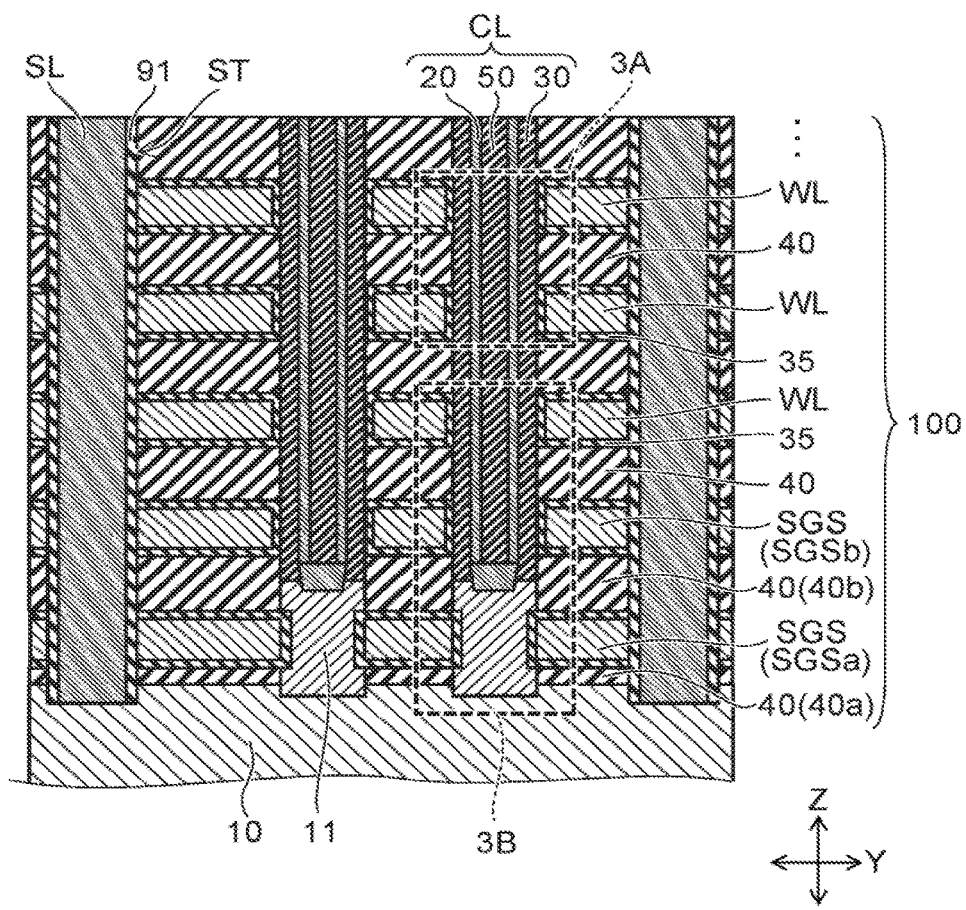
FIG. 2 is a schematic cross-sectional view of the semiconductor device of the first embodiment.

FIG. 2 is a schematic cross-sectional view of the semiconductor device of the first embodiment. FIG. 2 shows a portion of the substrate 10 side of the stacked body 100.

As shown in FIG. 2, a semiconductor pillar 11 is provided in the stacked body 100. The semiconductor pillar 11 is provided on the substrate 10, and in contact with the substrate 10. An upper surface of the semiconductor pillar 11 is surrounded with an insulator 40b of the insulator 40. The semiconductor pillar 11 includes, for example, silicon. The semiconductor pillar 11 is, for example, formed on an upper surface of the substrate 10 by vapor phase epitaxial growth method (for example, selective epitaxial growth method). The semiconductor pillar 11 has a crystalline structure being equal or close to a crystalline structure of the substrate 10, for example, has single crystalline structure.

The source-side select gate line SGS includes a first source-side select gate line SGSa and a second source-side select gate line SGSb. The first source-side select gate line SGSa is provided on the substrate 10 via an insulator 40a of the insulator 40. The second source-side select gate line SGSb is provided on the first source-side select gate line SGSa via the insulator 40b of the insulator 40. The second source-side select gate line SGSb is, for example, provided to be used as dummy gate line. The semiconductor pillar 11 is surrounded with at least one of electrode layers (SGS, WL, SGD). In the first embodiment, for example, the semiconductor pillar 11 is surrounded with the first source-side select gate line SGSa.

A blocking insulating film 35 is provided between the electrode layer (SGS, WL, SGD) and the insulator 40, and between the electrode layer (SGS, WL, SGD) and the columnar portion CL. In a portion shown in FIG. 2, the blocking insulating film 35 is provided each of portions detailed below.

(1) between the first source-side select gate line SGSa and the insulator 40a (2) between the first source-side select gate line SGSa and the insulator 40b (3) between the first source-side select gate line SGSa and the semiconductor pillar 11

(4) between the second source-side select gate line SGSb and the insulator 40b (5) between the second source-side select gate line SGSb and the insulator 40

(6) between the second source-side select gate line SGSb and the columnar portion CL (7) between the word line WL and the insulator 40

(8) between the word line WL and the columnar portion CL

The blocking insulating film 35 includes, for example, silicon oxide, or silicon oxide and aluminum oxide. The blocking insulating film 35 suppresses, for example, back-tunneling of the charge from the word line WL into the charge storage film 32 in the erasing operation. Else, the blocking insulating film 35 is also used as gate insulating film of the source-side select gate line SGS.

Although not shown in FIG. 2, for example, a barrier film may be provided between the blocking insulating film 35 and the electrode layer (SGS, WL, SGD). The barrier film includes, for example, titanium nitride, or a stacked body formed of titanium and titanium nitride.

The columnar portion CL includes a memory film 30, a semiconductor body 20, and a core layer 50. The memory film 30, the semiconductor body 20, and the core layer 50 extend in the Z-direction.

The memory film 30 is provided in contact with the stacked body 100. The memory film 30 is, for example, a tubular configuration. The memory film 30 is provided at a height being a height of the upper surface of the semiconductor pillar 11 or more. Here, "height" refers to the height in the Z-direction with reference to the upper surface of the substrate 10, and refers to the high position being higher from the substrate 10 toward the stacked body 100.

The semiconductor body 20 is provided on the memory film 30. The semiconductor body 20 is in contact with the semiconductor pillar 11, and electrically connected to the substrate 10.

The core layer 50 is provided on the semiconductor body 20. The core layer 50 is surrounded with the semiconductor body 20. The core layer 50 has insulation. The core layer 50 includes, for example, silicon oxide. The core layer 50 is, for example, a columnar configuration.

Figure 3A:
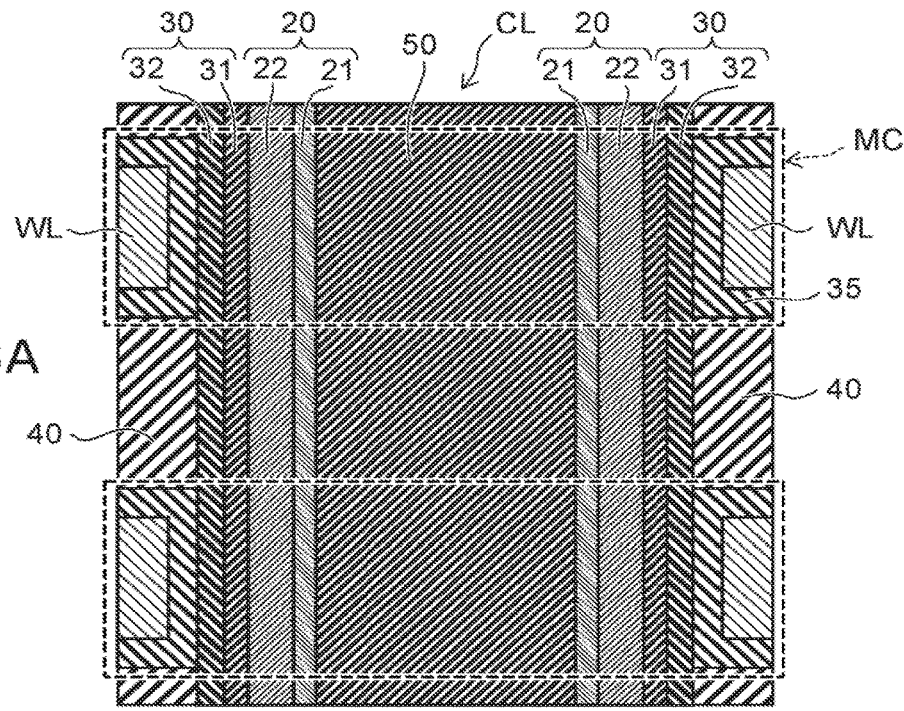
FIG. 3A is an enlarge schematic cross-sectional view in a frame 3A in FIG. 2.

FIG. 3A is a schematic cross-sectional view of the semiconductor device of the first embodiment. FIG. 3A is an enlarge schematic cross-sectional view of a broken line frame 3A in FIG. 2.

As shown in FIG. 3A, the memory film 30 includes a tunneling insulating film 31 and a charge storage film 32. The tunneling insulating film 31 is provided between the semiconductor body 20 and the charge storage film 32.

The tunneling insulating film 31 includes, for example, silicon oxide or a stacked body formed of silicon oxide and silicon nitride. The tunneling insulating film 31 is a potential barrier between the charge storage film 32 and the semiconductor body 20. When a charge is injected from the semiconductor body 20 into the charge storage film 32 (writing operation) and a charge is emitted from the charge storage film 32 to the semiconductor body 20 (erasing operation), the charge tunnels through the tunneling insulating film 31.

The charge storage film 32 includes, for example, a silicon nitride. The charge storage film 32 may include a hafnium oxide other than the silicon nitride. The charge storage film 32 includes a trap site trapping a charge in the film. The charge is trapped in the trap site. A threshold value of the memory cell MC changes depending on presence or absence of the charge trapped at the trap site and the amount of trapped charge. Thereby, the memory cell MC holds information.

The semiconductor body 20 includes a channel portion 21 and a cover portion 22. The cover portion 22 is provided between the channel portion 21 and the tunneling insulating film 31. The channel portion 21 and the cover portion 22 include, for example, a silicon. The silicon is, for example, polysilicon made of amorphous silicon crystallized, and has poly crystalline structure. For example, in the process forming the columnar portion CL, the cover portion 22 protects the tunneling insulating film 31 from etching.

Although not shown in FIG. 3A, the memory film 30 may include, for example, a cover insulating film. The cover insulating film is provided between the charge storage film 32 and the insulator 40. The cover insulating film includes, for example, silicon oxide. The cover insulating film may be, for example, a stacked body formed of silicon oxide and aluminum oxide. For example, in the process forming the electrode layer (SGS, WL, SGD), the cover insulating film protects the charge storage film 32 from etching.

Figure 3B:
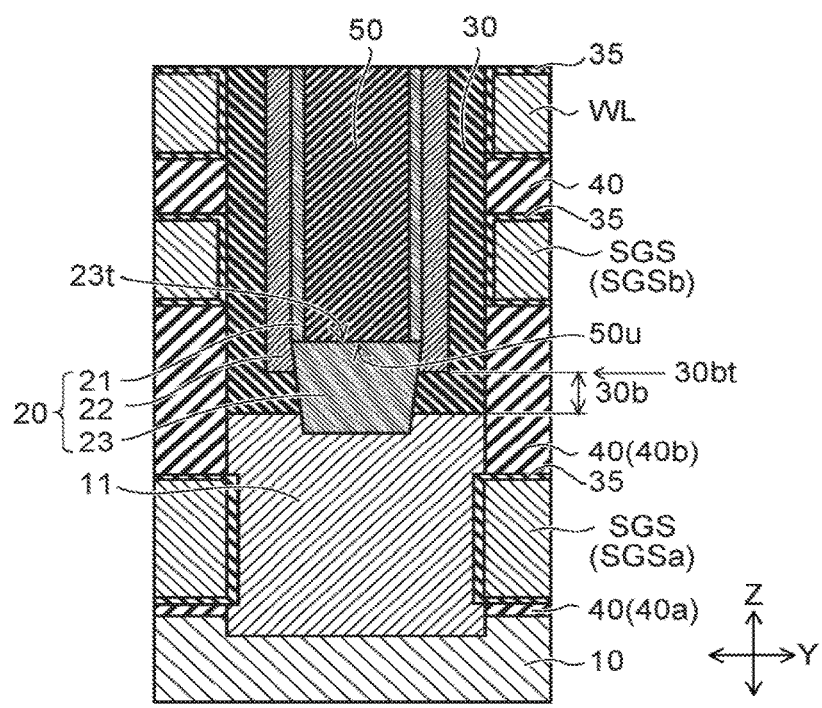
FIG. 3B is an enlarge schematic cross-sectional view in a frame 3B in FIG. 2.

FIG. 3B is a schematic cross-sectional view of the semiconductor device of the first embodiment. FIG. 3B is an enlarge schematic cross-sectional view of a broken line frame 3B in FIG. 2.

The memory film 30 has a lower end portion 30b. The lower end portion 30b of the memory film 30 is surrounded with the insulator 40b. The lower end portion 30b of the memory film 30 is, for example, in contact with the upper surface of the semiconductor pillar 11. An upper surface 30bt of the lower end portion 30b of the memory film 30 is in contact with the semiconductor body 20.

The semiconductor body 20 further includes a lower end portion 23. The lower end portion 23 of the semiconductor body 20 is provided between the channel portion 21 and the semiconductor pillar 11. The lower end portion 23 of the semiconductor body 20 is surrounded with the lower end portion 30b of the memory film 30 and the insulator 40b. The lower end portion 23 of the semiconductor body 20 is in contact with the upper surface of the semiconductor pillar 11 and the lower end portion 30b of the memory film 30. The upper surface 23t of the lower end portion 23 of the semiconductor body 20 is provided at a height being a height of the upper surface 30bt of the lower end portion 30b of the memory film 30 or more. Thereby, the upper surface 23t of the lower end portion 23 of the semiconductor body 20 is in contact with a lower surface 50u of the core layer 50 at a portion where the cover portion 22 exists in the columnar portion CL.

Figure 3C:
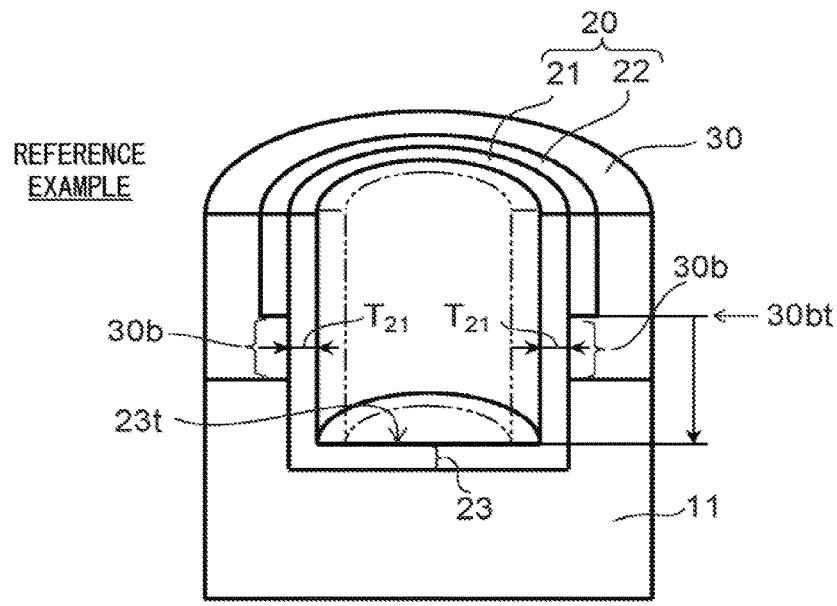
FIG. 3C is a schematic cross-sectional view of the semiconductor device of a reference example.
Figure 3D:
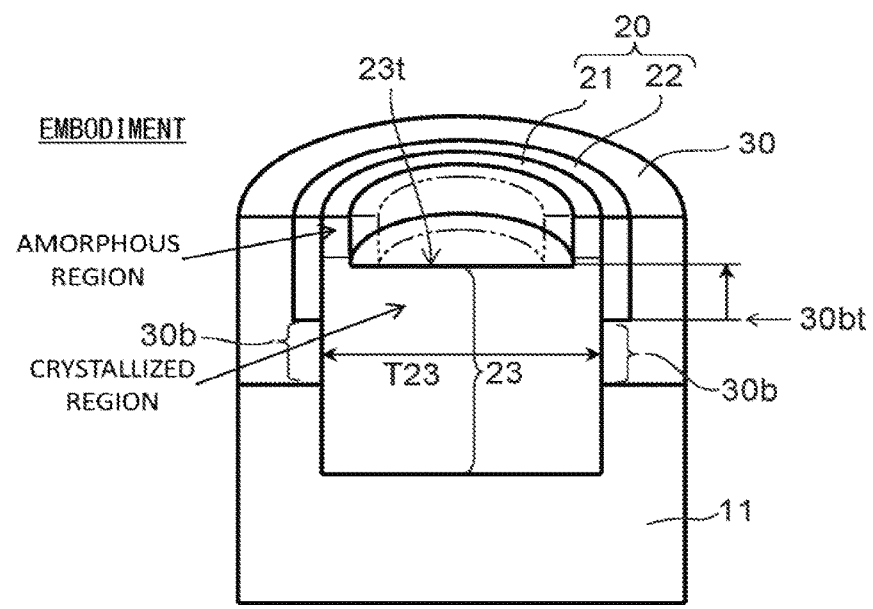
FIG. 3D is a schematic cross-sectional view of the semiconductor device of the first embodiment.

FIG. 3C is a schematic cross-sectional view of the semiconductor device of a reference example. FIG. 3D is a schematic cross-sectional view of the semiconductor device of the first embodiment. FIG. 3C and FIG. 3D show a connection portion between the semiconductor body 20 and the semiconductor pillar 11. Two-dot chain lines shown in FIG. 3C and FIG. 3D refer to a state of the semiconductor body 20 having a heavy thickness.

As shown in the reference example in FIG. 3, only the channel portion 21 of the semiconductor body 20 is provided in a portion surrounded with the lower end portion 30b of the memory film 30 ordinarily. A height of the upper surface 23t of the lower end portion 23 of the semiconductor body 20 is lower than a height of the upper surface 30bt of the lower end portion 30b of the memory film 30. In this structure, as viewed from the Z-direction, an area (cross-sectional area along XY plane) of the channel portion 21 provided in the portion surrounded with the lower end portion 30b of the memory film 30 depends on a thickness $T_{21}$ of the channel portion 21. The thickness $T_{21}$ of the channel portion 21 is set thinner than a diameter of an opening reaching the semiconductor pillar 11, because of providing the core layer 50 in the columnar portion CL. Thus, with the reduction or increasing the number of stacks of the device, a resistance value of the semiconductor body 20 is increased, for example, in the portion surrounded with the lower end portion 30b of the memory film 30. As the result, the cell current tends to decrease. When the thickness of the channel portion 21 is thin shown in FIG. 3C because of decreasing total number of trap levels in the semiconductor body 20, the decreasing the cell current is remarkable.

In contrast, in the first embodiment, as shown in FIG. 3D, the lower end portion 23 of the semiconductor body 20 is provided in the portion surrounded with the lower end portion 30b of the memory film 30, and has a columnar configuration. The opening reaching the semiconductor pillar 11 is, for example, filled with the lower end portion 23 of the semiconductor body 20. The height of upper surface 23t of the lower end portion 23 of the semiconductor body 20 is the height of the upper surface 30bt of the lower end portion 30b of the memory film 30 or more. The lower end portion 23 of the semiconductor body 20 is a columnar configuration against a tubular configuration having a bottom of the semiconductor body 20 shown in FIG. 3C. A diameter $T_{23}$ of the lower end portion 23 of the semiconductor body 20 having the columnar configuration may be, for example, increased until equal to the diameter of the opening reaching the semiconductor pillar 11. Thus, for example, in the portion surrounded with the lower end portion 30b of the memory film 30, the circumstance in that the resistance value of the semiconductor body 20 is increased may be suppressed. Therefore, in the first embodiment, compared with the reference example, the decreasing the cell current with the reduction or increasing the number of stacks of the device may be suppressed.

In the first embodiment, the channel portion 21 may be used as an amorphous region, and the lower end portion 23 of the semiconductor body 20 may be used as a crystallized region. An etching rate of the amorphous region and an etching rate of the crystallized region may be different from each other. For example, an etching promoted in the amorphous region and an etching delayed in the crystallized region may be performed. Therefore, in the first embodiment, as shown in FIG. 3D, for decreasing total number of the trap levels in the semiconductor body 20, the thickness of the channel portion 21 may be also selectively thinned. At this juncture, because a progress of the etching to the lower end portion 23 of the semiconductor body 20 is suppressed, a position of the upper surface 23t of the lower end portion 23 of the semiconductor body 20 may be maintained at a height being the height of the upper surface 30bt of the lower end portion 30b of the memory film 30 or more. Thereby, for example, in the portion surrounded with the lower end portion 30b of the memory film 30, even if the thickness of the channel portion 21 is thin, the increasing the resistance value of the semiconductor body 20 may be suppressed.

First Embodiment: Manufacturing Method

Next, one example of a method for manufacturing the semiconductor device of the first embodiment will be described.

FIG. 4A to FIG. 9B are schematic cross-sectional views showing a method for manufacturing the semiconductor device of the first embodiment. Cross-sections shown in FIG. 4A, FIG. 9A, and FIG. 9B correspond to the cross-section shown in FIG. 2. Cross-sections shown in FIG. 4B to FIG. 8B correspond to the cross-section in FIG. 3B.

<Forming the Stacked Body 100>

Figure 4A:
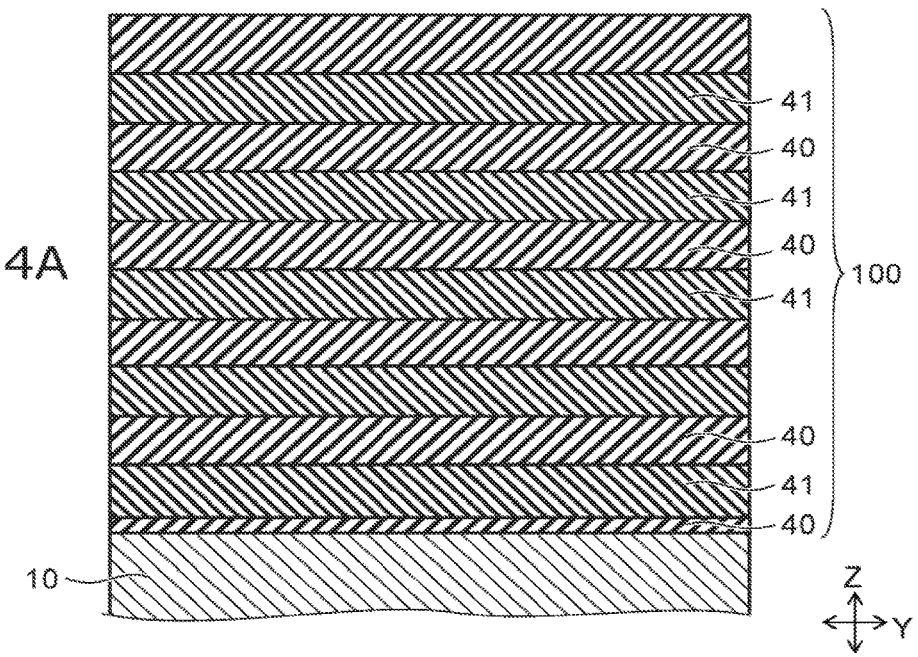
FIG. 4A to FIG. 9B are schematic cross-sectional views showing a method for manufacturing the semiconductor device of the first embodiment.

As shown in FIG. 4A, the stacked body 100 is formed on the substrate 10. The stacked body 100 is in a state where the replacement members 41 (first layers) and the insulators 40 are alternately stacked. The replacement member 41 is a member to be replaced by the electrode layers (SGS, WL, SGD) later. The material of the replacement member 41 is selected from materials that can take an etching selection ratio to the insulator 40. For example, when a silicon oxide is selected as the insulator 40, a silicon nitride is selected as the replacement member 41.

<Forming the Hole MH>

Figure 4B:
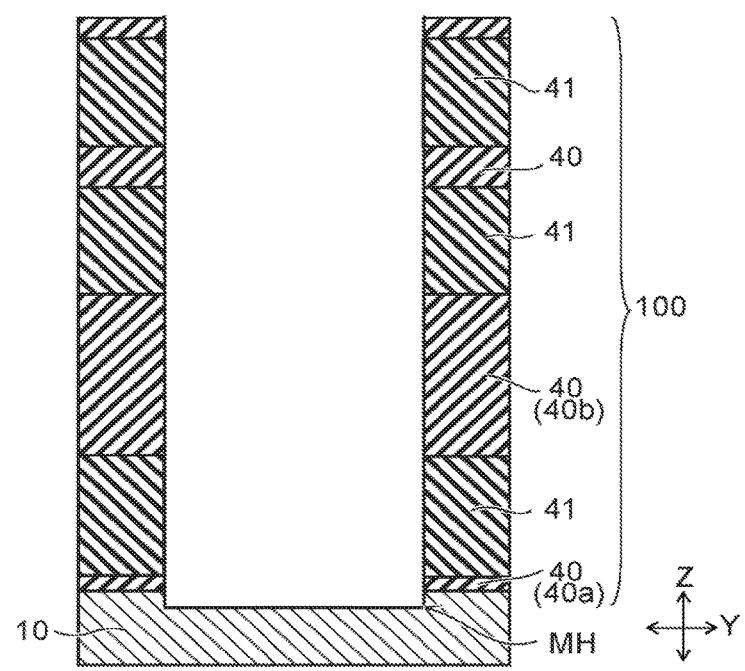

Next, as shown in FIG. 4B, the hole MH is formed in the stacked body 100. The hole MH pierces in the stacked body 100 and reaches the substrate 10. The substrate 10 is exposed from a bottom surface of the hole MH.

<Forming the Semiconductor Pillar 11>

Figure 5A:
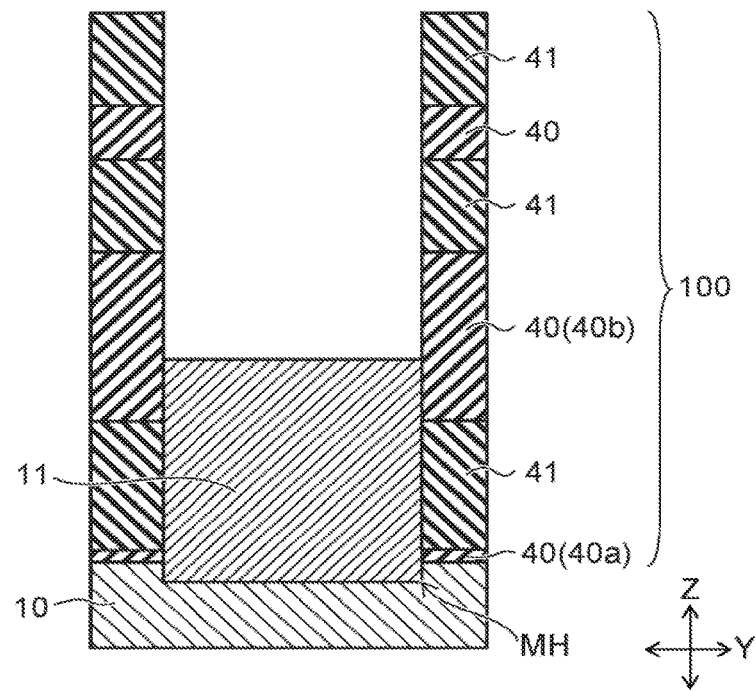

Next, as shown in FIG. 5A, the semiconductor pillar 11 is formed in the hole MH. The upper surface of the semiconductor pillar 11 is formed continued from an upper surface of the substrate 10 exposed from the hole MH to a height of a middle portion of the insulator 40. The semiconductor pillar 11 is, for example, formed using the vapor phase epitaxial growth formed from the upper surface of the substrate 10. At this time, the crystalline structure of the substrate 10 as a base is inherited to the semiconductor pillar 11. Thus, the semiconductor pillar 11 has a crystalline structure being equal or close to a crystalline structure of the substrate 10, for example, has single crystalline structure.

Here, for example, before performing vapor phase epitaxial growth method, the etching to the base (surface of the substrate 10 in the embodiment) may be performed. By performing the etching, a damage portion of a surface of the base may be removed, the damage is formed by forming the hole MH. Thereby, the crystalline structure of the structure formed by vapor phase epitaxial growth method may be further close to the crystalline structure of the base. Similarly in the following, before performing vapor phase epitaxial growth method or solid phase epitaxial growth method, the etching to the base may be performed.

<Forming the Memory Film 30 and the Cover Portion 22s>

Figure 5B:
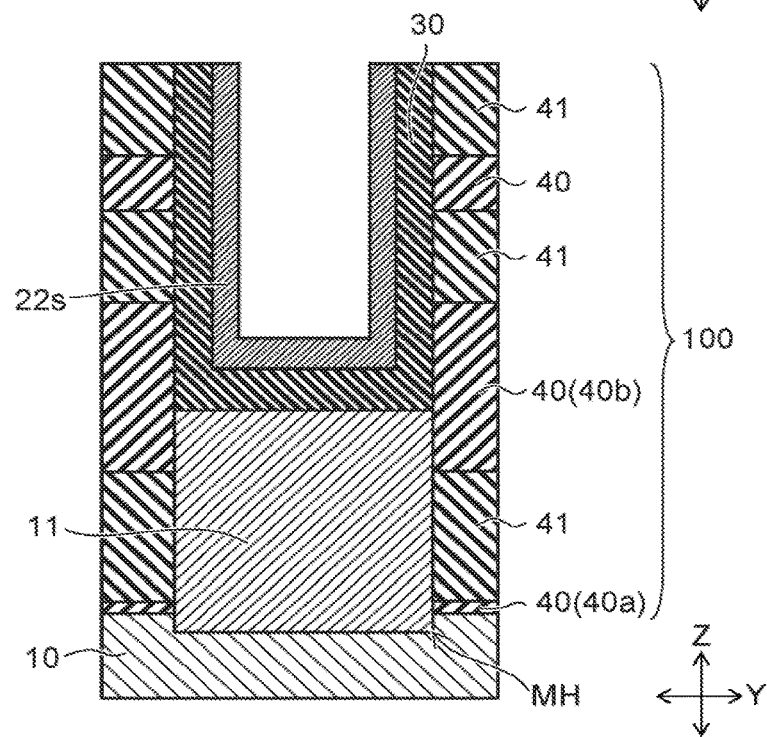

Next, as shown in FIG. 5B, the memory film 30 is formed on an inner wall of the hole MH and the upper surface of the semiconductor pillar 11. The memory film 30 is formed by forming the charge storage film 32 and the tunneling insulating film 31 shown in FIG. 3A in the hole MH. After that, the cover portion 22s is formed on the memory film 30. The cover portion 22s is, for example, a non-crystalline film of a silicon-based, such as amorphous silicon.

<Forming the Recess Portion 30r>

Figure 6A:
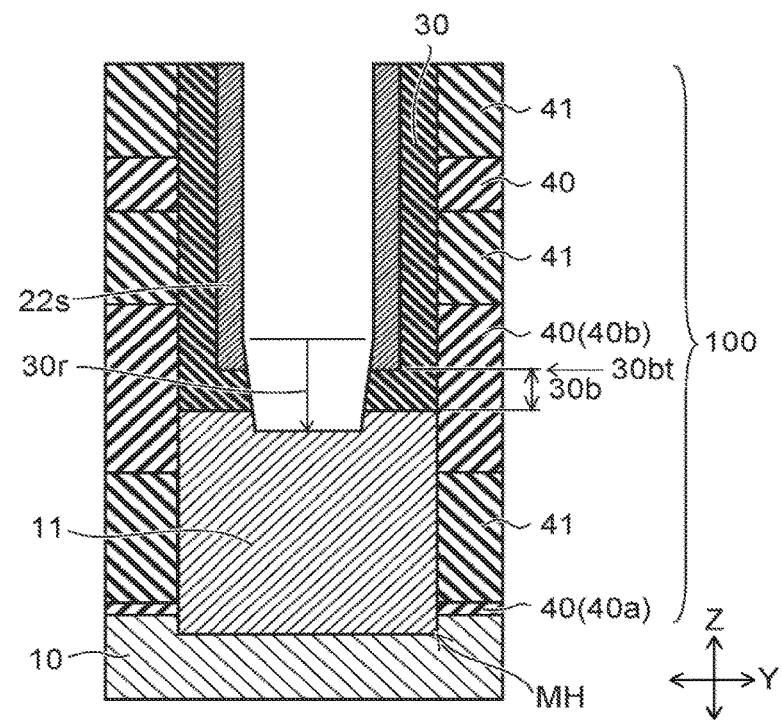

Next, as shown in FIG. 6A, a bottom portion of the cover portion 22s and a bottom portion of the memory film 30 are removed, and a recess portion 30r is formed. An arrow in the figure shows the recess portion 30r. The recess portion 30r is, for example, formed by performing an isotropic etching from the bottom portion of the cover portion 22s to inside of the semiconductor pillar 11. In this etching, for example, RIE (Reactive Ion Etching) method is performed. Thereby, the upper surface of the semiconductor pillar 11 is exposed from the recess portion 30r.

<Forming the Semiconductor Film 20s>

Figure 6B:
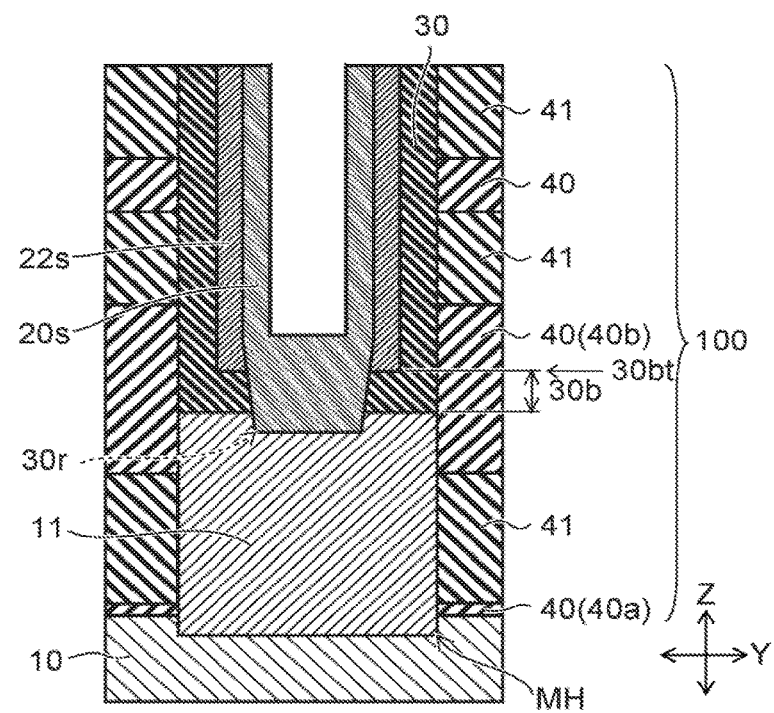

Next, as shown in FIG. 6B, a semiconductor film 20s is formed in the recess portion 30r and on the cover portion 22s. The semiconductor film 20s is formed continued from on the semiconductor pillar 11 exposed from the recess portion 30r to on the cover portion 22s. At this time, the recess portion 30r is filled with the semiconductor film 20s. For example, a non-crystalline film of a silicon-based, such as amorphous silicon is selected as the semiconductor film 20s. For example, at least one of CVD (Chemical Vapor Deposition) or ALD (Atomic Layer Deposition) is used as a method of forming the semiconductor film 20s.

<Forming the Lower End Portion 23 of the Semiconductor Body>

Figure 7A:
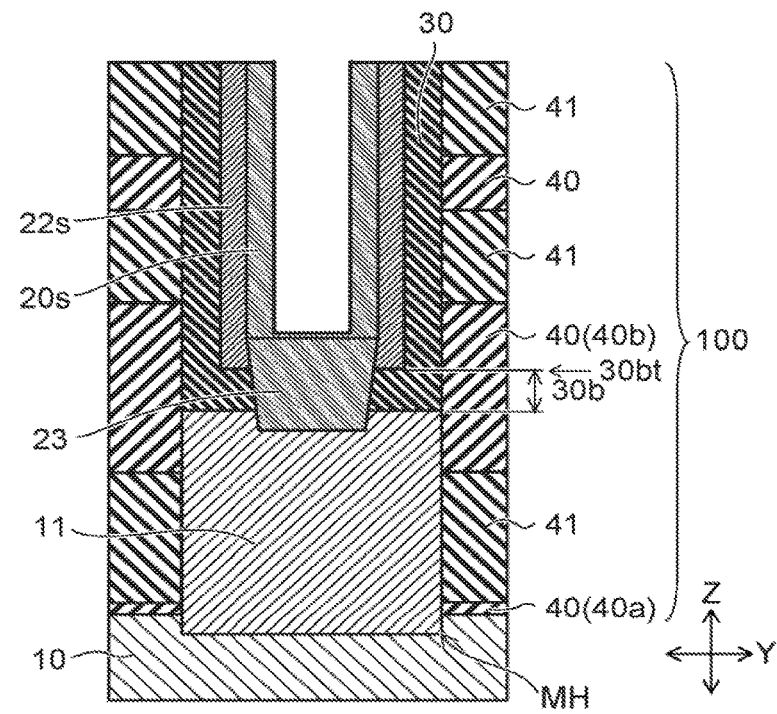

Next, as shown in FIG. 7A, the semiconductor film 20s formed in the recess portion 30r is crystallized. Thereby, the lower end portion 23 of the semiconductor body is formed. An upper surface of the lower end portion 23 of the semiconductor body is, for example, formed continued from the upper surface of the semiconductor pillar 11 to a height being a height of the upper surface 30bt of the lower end portion 30b of the memory film 30 or more.

For example, solid phase epitaxial growth method is used as a method of crystallizing the semiconductor film 20s. At this time, the crystalline structure of the semiconductor pillar 11 as a base is inherited to the lower end portion 23 of the semiconductor body. Thus, the lower end portion 23 of the semiconductor body has a crystalline structure being equal or close to a crystalline structure of the semiconductor pillar 11, for example, has single crystalline structure. Thereby, compared with the case of forming the semiconductor body 20 having poly crystalline structure in the recess portion 30r, the cell current may be improved.

<Recessing the Semiconductor Film 20s>

Figure 7B:
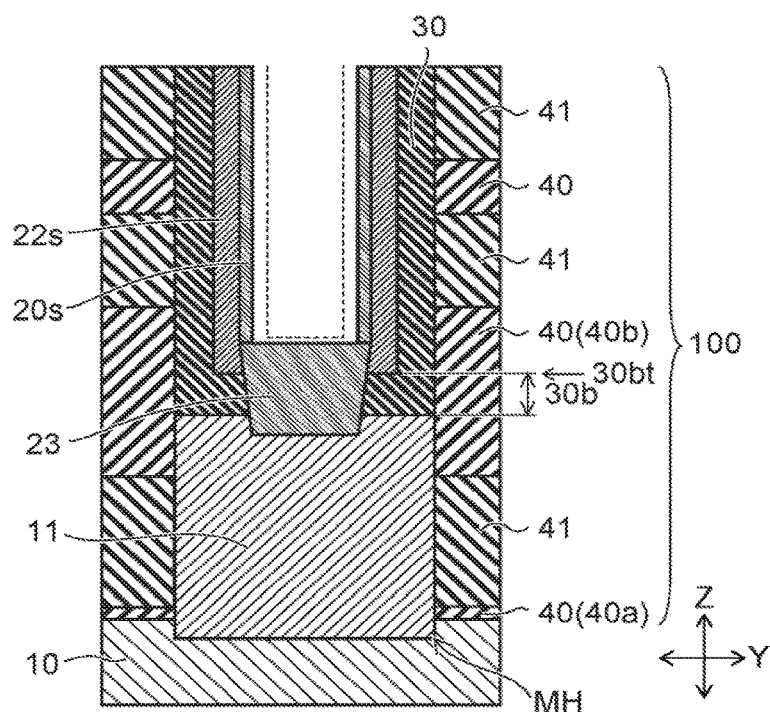

Next, as shown in FIG. 7B, the semiconductor film 20s is recessed. At this time, the lower end portion 23 of the semiconductor body may be recessed simultaneously with the semiconductor film 20s. A broken line portion of the figure shows a surface of the semiconductor film 20s and a surface of the lower end portion 23 of the semiconductor body before recessing. For example, an isotropic etching is used as a method of recessing the semiconductor film 20s. The isotropic etching is, for example, a dry etching using chlorine gas. At this time, as shown in FIG. 3D, the position of the upper surface 23t of the lower end portion 23 of the semiconductor body 20 may be maintained at a height being a height of the upper surface 30bt of the lower end portion 30b of the memory film 30 or more, and the thickness of a semiconductor film 20s may be thin. Thus, in the portion surrounded with the lower portion 30b of the memory film 30, the increasing the resistance value of the lower end portion 23 of the semiconductor body 20 may be suppressed.

<Crystallizing the Semiconductor Film 20s and the Cover Portion 22s>

Figure 8A:
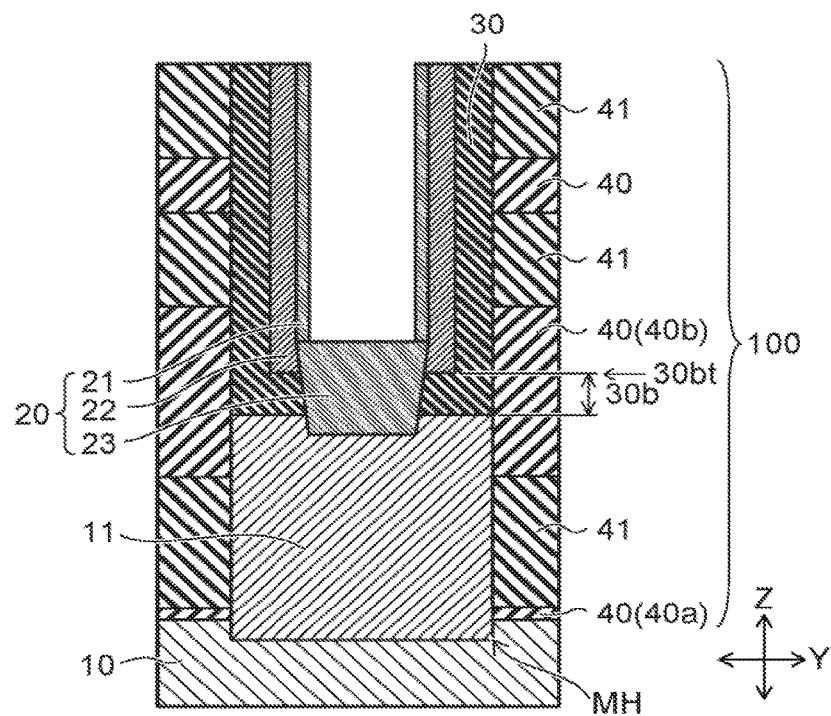

Next, as shown in FIG. 8A, the semiconductor film 20s and the cover portion 22s is annealed (crystallization annealing). Thereby, the channel portion 21 crystallized and the cover portion 22 crystallized is formed. The channel portion 21 and the cover portion 22 include polysilicon made amorphous silicon crystallized. At this time, the lower end portion 23 of the semiconductor body has an interface between the channel portion 21 and the lower end portion 23, and between the cover portion 22 and the lower end portion 23. Thereby, the semiconductor body 20 including the channel portion 21, the cover portion 22, and the lower end portion 23 of the semiconductor body is formed.

<Forming the Core Layer 50>

Figure 8B:
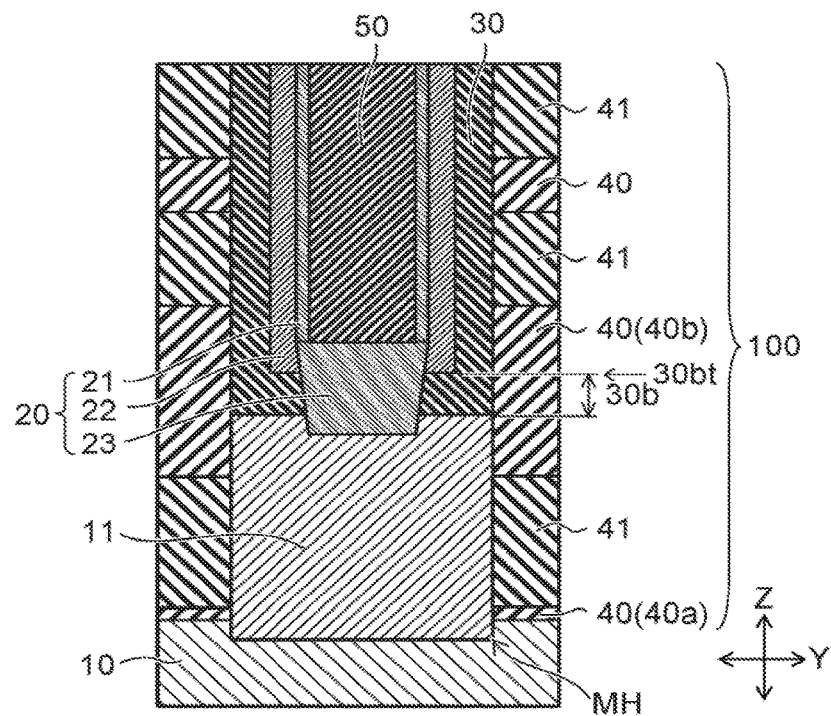

Next, as shown in FIG. 8B, the core layer 50 is formed on the channel portion 21 and the lower end portion 23 of the semiconductor body 20. For example, silicon oxide is selected as the core layer 50. The core layer 50 may be, for example, formed before annealing the semiconductor film 20s and the cover portion 22.

<Forming the Electrode Layer (SGS, WL, SGD)>

Figure 9A:
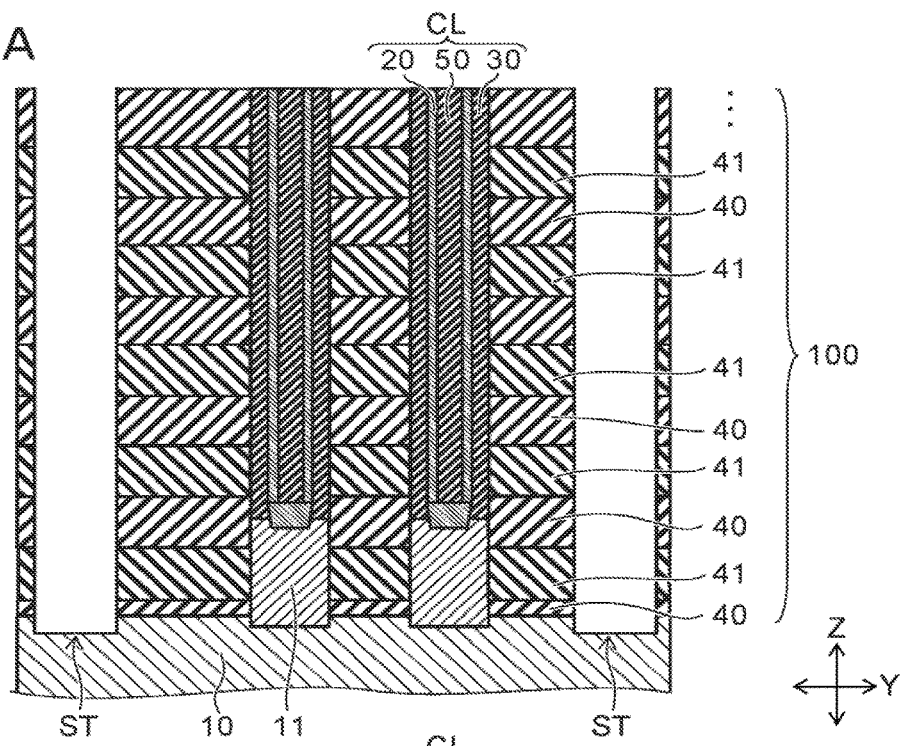

Next, as shown in FIG. 9A, the slit ST is formed in the stacked body 100. The slit ST pierces the stacked body 100 and reaches the substrate 10. The slit ST extends in the X-direction. The replacement member 41 and the insulator 40 are exposed from a side wall of the slit ST.

Figure 9B:
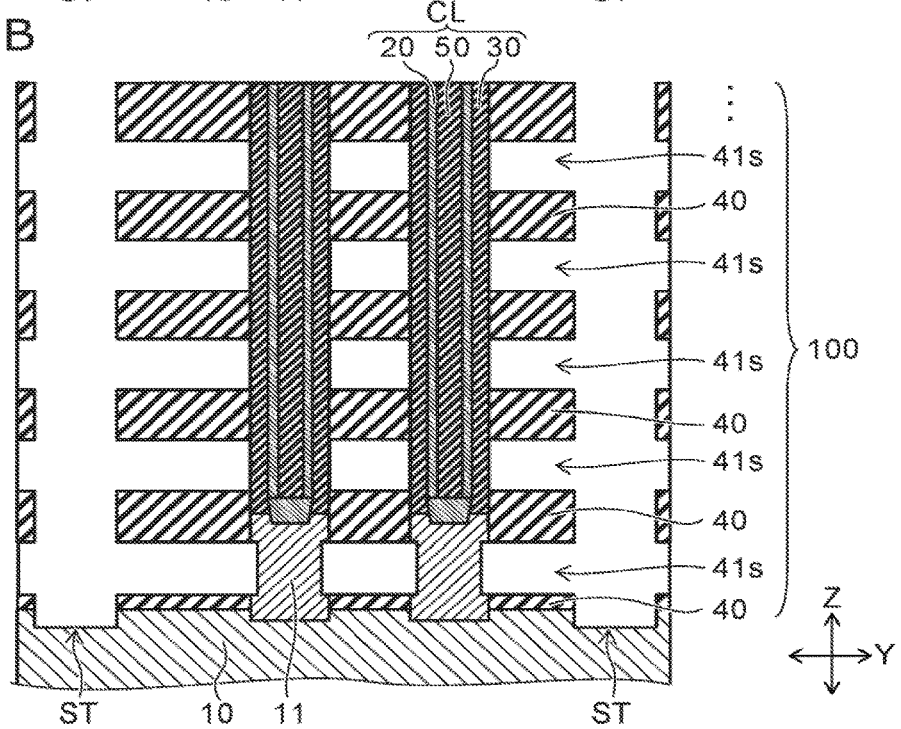

Next, as shown in FIG. 9B, the replacement member 41 is removed from the stacked body 100 via the slit ST. Thereby, a space 41s is formed. After that, as shown in FIG. 2, the blocking insulating film 35 and the electrode layer (SGS, WL, SGD) is formed in the space 41s via the slit ST.

<Forming the Source Line SL, the Bit Line BL and so On>

After that, the insulating film 91 and the source line SL are formed in the slit ST, and the bit line BL and so on shown in FIG. 1 are formed on the stacked body 100. The semiconductor device of the first embodiment may be, for example, manufactured by the method for manufacturing above described.

Here, after recessing the semiconductor film 20s above describe, the thickness of the lower end portion 23 of the semiconductor body may be further increased. In this case, for example, using selective epitaxial growth, a process of forming the lower end portion 23 of the semiconductor body to be thick and a process of recessing the semiconductor film 20s by etching are repeated. Further, for example, the semiconductor film 20s is further formed on the lower end portion 23 of the semiconductor body and the semiconductor film 20s, and the solid phase epitaxial growth method and the isotropic etching above describe may be performed.

Second Embodiment: Semiconductor Device

Figure 10:
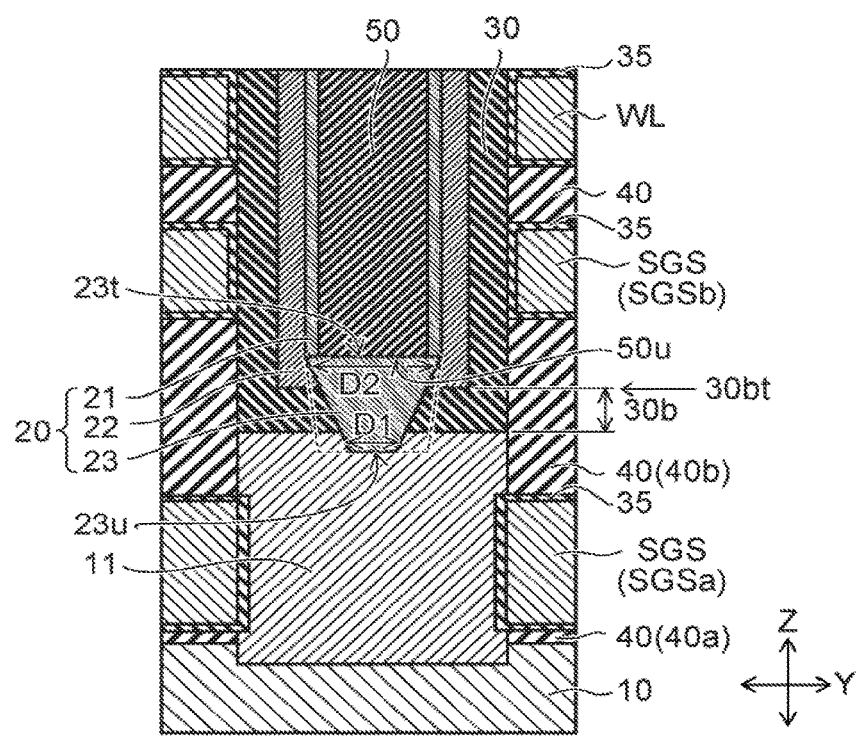
FIG. 10 is a schematic cross-sectional view of the semiconductor device of a second embodiment.

FIG. 10 is a schematic cross-sectional view of the semiconductor device of the second embodiment. A cross-section shown in FIG. 10 corresponds to the cross-section shown in FIG. 3B.

As shown in FIG. 10, the semiconductor device of the second embodiment is different from the semiconductor device of the first embodiment in that the lower end portion 23 of the semiconductor body 20 has a salient configuration (tapered configuration) toward a lower surface.

Also in the second embodiment, the lower end portion 23 of the semiconductor body 20 is provided in the portion surrounded with the lower end portion 30b of the memory film 30. Thereby, the decreasing the cell current may be suppressed.

Further, in the second embodiment, an angle of side surface with respect to the lower surface 23u in the lower end portion 23 of the semiconductor body 20 is large as compared with an angle in the lower end portion 23 of the semiconductor body 20 of the first embodiment (broken line portion shown in FIG. 10). For example, as viewed from the Z-direction, a diameter D2 of an upper surface 23t of the lower end portion 23 of the semiconductor body 20 is two times a diameter D1 of the lower surface 23u or more. Thus, the possibility of including defect such as void in the lower end portion 23 of the semiconductor body 20 may be reduced. Thereby, when the plurality of columnar portions CL is formed, the fluctuation of each the cell current of columnar portion CL may be suppressed.

Second Embodiment: Manufacturing Method

Next, one example of a method of manufacturing the semiconductor device of the second embodiment will be described.

Figure 11A:
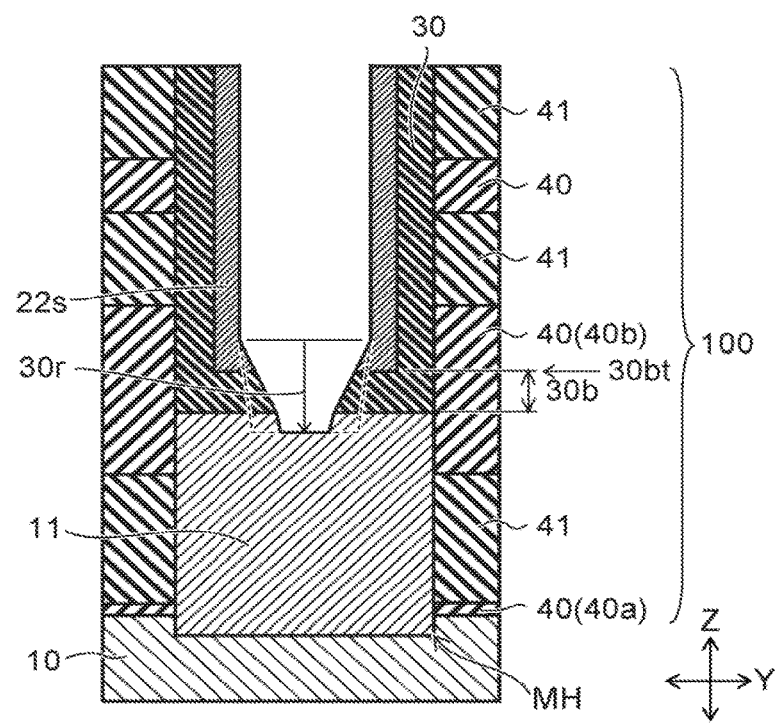
FIG. 11A and FIG. 11B are schematic cross-sectional views showing a method for manufacturing the semiconductor device of the second embodiment.
Figure 11B:
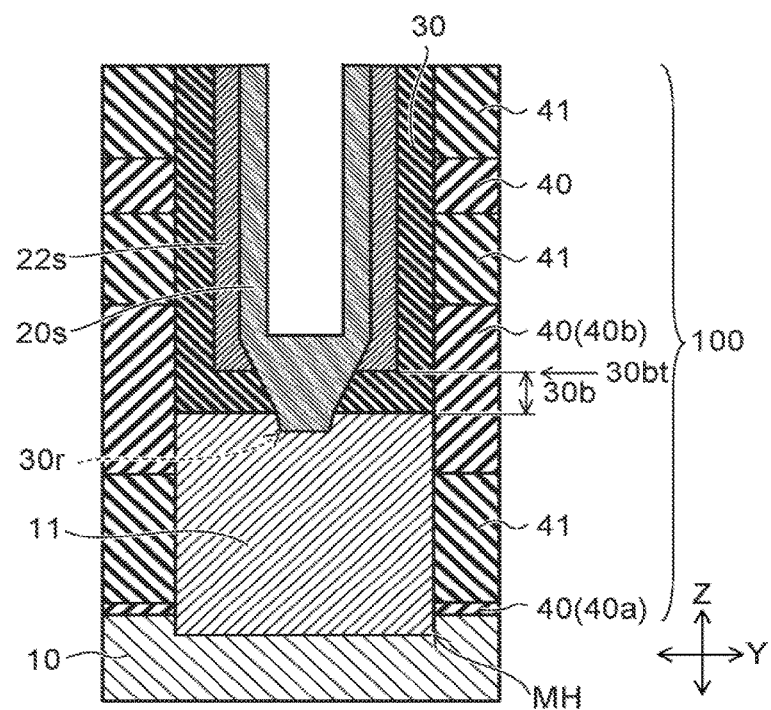

FIG. 11A and FIG. 11B are schematic cross-sectional views of the semiconductor device of the second embodiment. Cross-sections shown in FIG. 11A and FIG. 11B correspond to the cross-section shown in FIG. 3B.

<Forming the Stacked Body 100 to Forming the Recess Portion 30r>

For example, according to the manufacturing method described with reference to FIG. 4A to FIG. 5B, the forming of the stacked body 100 to the forming of the cover portion 22s are performed. After forming the cover portion 22s, by forming the recess portion 30r by removing the bottom portion of the cover portion 22s and the bottom portion of the memory film 30, the structure shown in FIG. 11A is achieved. The arrow in the figure shows the recess portion 30r. At this time, the recess portion 30r formed is the salient configuration, and a diameter of the recess portion 30r is smaller toward the semiconductor pillar 11. Thereby, as viewed from the Z-direction, a diameter of the bottom surface of the recess portion 30r is small as compared with the diameter of the bottom surface of the recess portion of the first embodiment (broken line portion shown in FIG. 11A).

<Forming the Semiconductor Film 20s>

Next, as shown in FIG. 11B, the semiconductor film 20s is formed in the recess portion 30r and on the cover portion 22s. At this time, because the recess portion 30r has the salient configuration, the recess portion 30r may be easily filled with the semiconductor film 20s. Thereby, the generating defect such as void in the semiconductor film 20s may be suppressed.

<Forming the Lower End Portion 23 of the Semiconductor Body 20 to Forming the Bit Line BL and so On>

After that, for example, by the similar process to a detail described with reference to FIG. 7A to FIG. 9B, FIG. 1, and FIG. 2, the semiconductor device of the second embodiment may be formed.

Third Embodiment: Semiconductor Device

Figure 12:
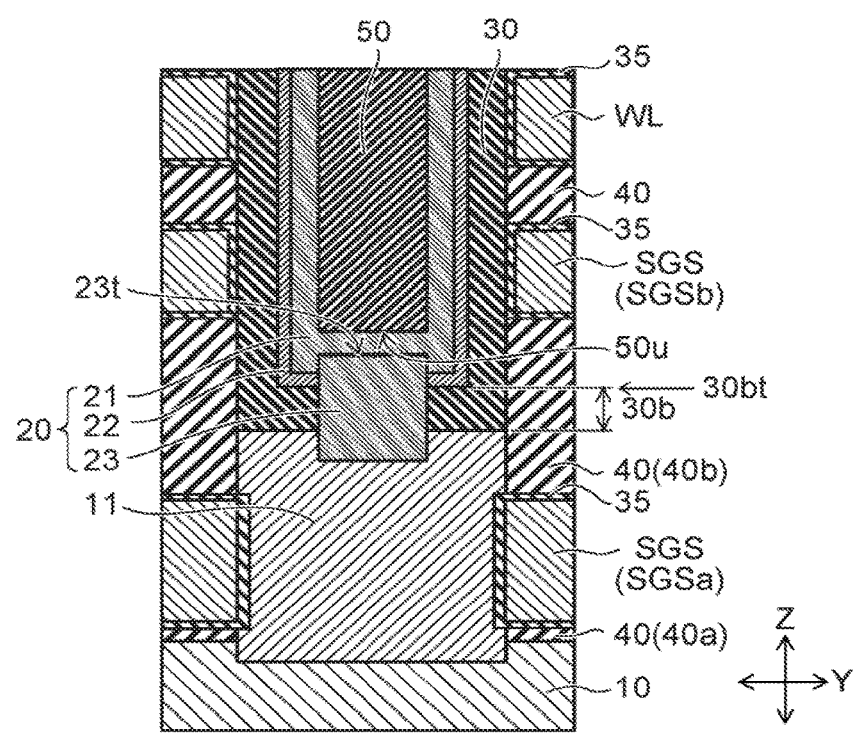
FIG. 12 is a schematic cross-sectional view of the semiconductor device of a third embodiment.

FIG. 12 is a schematic cross-sectional view of the semiconductor device of the third embodiment. A cross-section shown in FIG. 12 corresponds to the cross-section shown in FIG. 3B.

As shown in FIG. 12, the semiconductor device of the third embodiment is different from the semiconductor device of the first embodiment in that a portion of the lower end portion 23 of the semiconductor body 20 is surrounded with the channel portion 21, and the lower end portion 23 of the semiconductor body 20 is formed by vapor phase epitaxial growth method.

Also in the third embodiment, the lower end portion 23 of the semiconductor body 20 is provided in the portion surrounded with the lower end portion 30b of the memory film 30. Thereby, the decreasing the cell current may be suppressed.

Further, in the third embodiment, the channel portion 21 is provided between the upper surface 23t of the lower end portion 23 of the semiconductor body 20 and the lower surface 50u of the core layer 50. On the upper surface 30bt of the lower end portion 30b of the memory film 30, entire of the upper surface 23t and a side surface of the lower end portion 23 of the semiconductor body 20 are in contact with the channel portion 21. Thereby, in case of reducing an inner diameter of the lower end portion 30b of the memory film 30 also, the increasing the contact resistance between the lower end portion 23 of the semiconductor body 20 and the channel portion 21 may be suppressed.

Third Embodiment: Manufacturing Method

Next, one example of a method for manufacturing the semiconductor device of the third embodiment will be described.

FIG. 13A to FIG. 15B are schematic cross-sectional views showing a method for manufacturing the semiconductor device of the third embodiment. Cross-sections shown in FIG. 13A to FIG. 15B correspond to the cross-section in FIG. 3B.

<Forming the Stacked Body 100 to Forming the Semiconductor Pillar 11>

For example, according to the manufacturing method described with reference to FIG. 4A to FIG. 5A, the forming of the stacked body 100 to the forming of the semiconductor pillar 11 shown in FIG. 13 are performed.

<Forming the Memory Film 30, the Cover Portion 22s, and the Cover Film 36>

Figure 13A:
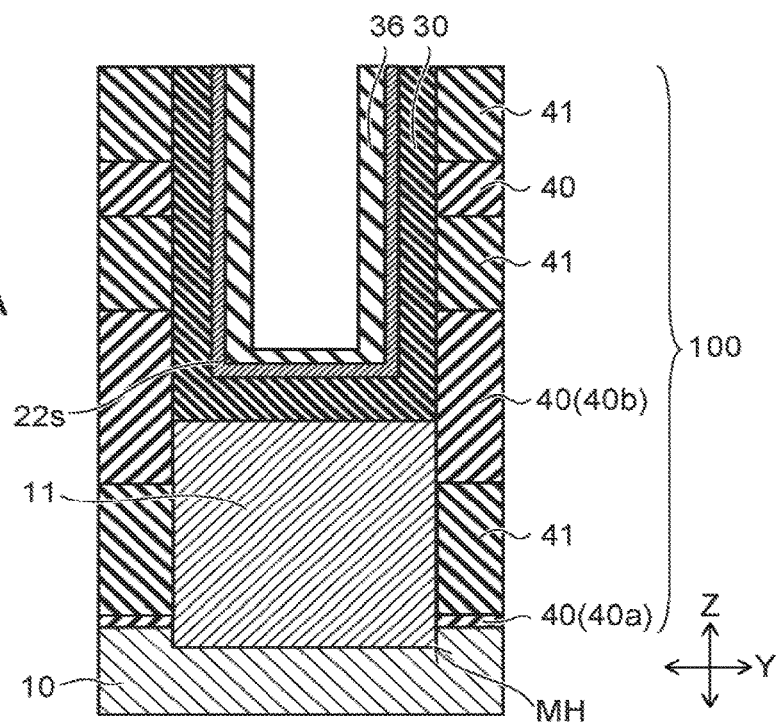

Next, as shown in FIG. 13A, the memory film 30 is formed on the inner wall of the hole MH and the upper surface of the semiconductor pillar 11. After that, the cover portion 22s is formed on the memory film 30. After that, the cover film 36 is formed on the cover portion 22s. For example, silicon nitride or silicon oxide is selected as the cover film 36. For example, the cover film 36 may be formed by performing nitriding treatment or oxidizing treatment the surface of the cover portion 22s.

<Forming the Recess Portion 30r>

Figure 13B:
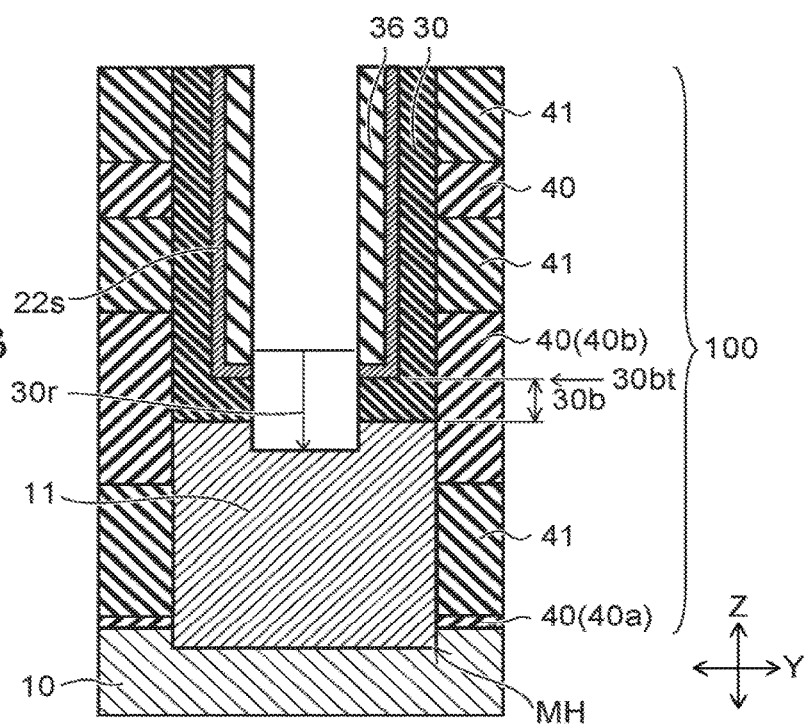

Next, as shown in FIG. 13B, the bottom portion of the cover film 36, the bottom portion of the cover portion 22s, and the bottom portion of the memory film 30 are removed, and the recess portion 30r is formed. An arrow in the figure shows the recess portion 30r.

<Forming the Lower End Portion 23 of the Semiconductor Body>

Next, as shown in FIG. 14A, the lower end portion 23 of the semiconductor body is formed in the recess portion 30r. The upper surface 23t of the lower end portion 23 of the semiconductor body is formed continued from the upper surface of the semiconductor pillar 11 to a height being the height of the upper surface 30bt of the lower end portion 30b of the memory film 30 or more, the upper surface of the semiconductor pillar 11 is exposed from the recess portion 11r. The lower end portion 23 of the semiconductor body is, for example, in contact with the side surface of the cover film 36. The lower end portion 23 of the semiconductor body is, for example, formed using the vapor phase epitaxial growth formed from the upper surface of the semiconductor pillar 11. At this time, the crystalline structure of the semiconductor pillar 11 as a base is inherited to the lower end portion 23 of the semiconductor body. Thus, the lower end portion 23 of the semiconductor body has a crystalline structure being equal or close to the crystalline structure of the semiconductor pillar 11, for example, has single crystalline structure. Thereby, compared with the case of forming the channel portion 21 having poly crystalline structure in the recess portion 30r, the cell current may be improved. Further, in the third embodiment, when the vapor phase epitaxial growth method is performed, the cover film 36 is formed on the cover portion 22s. Thereby, the film growing on the cover portion 22s as a base may be protected.

<Removing the Cover Film 36>

Next, as shown in FIG. 14B, the cover film 36 is removed. A dot line in the figure shows the surface of the cover film 36 before removing. By removing the cover film 36, an area of the lower end portion 23 of the semiconductor body in contact with the channel portion 21 may be enlarged. Thereby, the contact resistance between the lower end portion 23 of the semiconductor body and the channel portion 21 may be reduced.

<Forming the Semiconductor Film 20s>

Figure 15A:
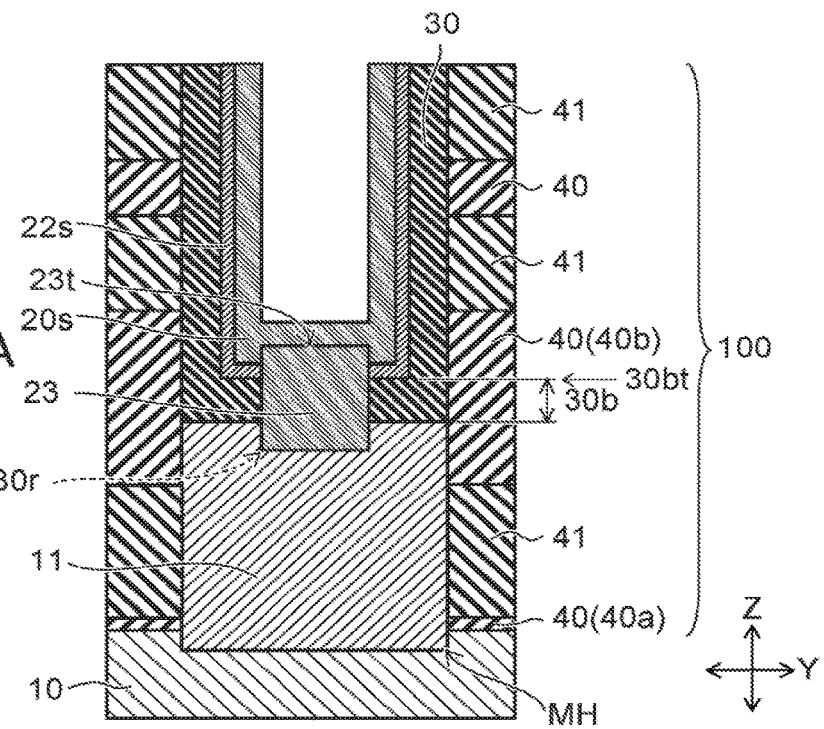

Next, as shown in FIG. 15A, the semiconductor film 20s is formed on the lower end portion 23 of the semiconductor body and the cover portion 22s. At this time, the semiconductor film 20s is in contact with the upper surface 23t and the side surface of the lower end portion 23 of the semiconductor body.

<Crystallizing the Semiconductor Film 20s and the Cover Portion 22s>

Figure 15B:
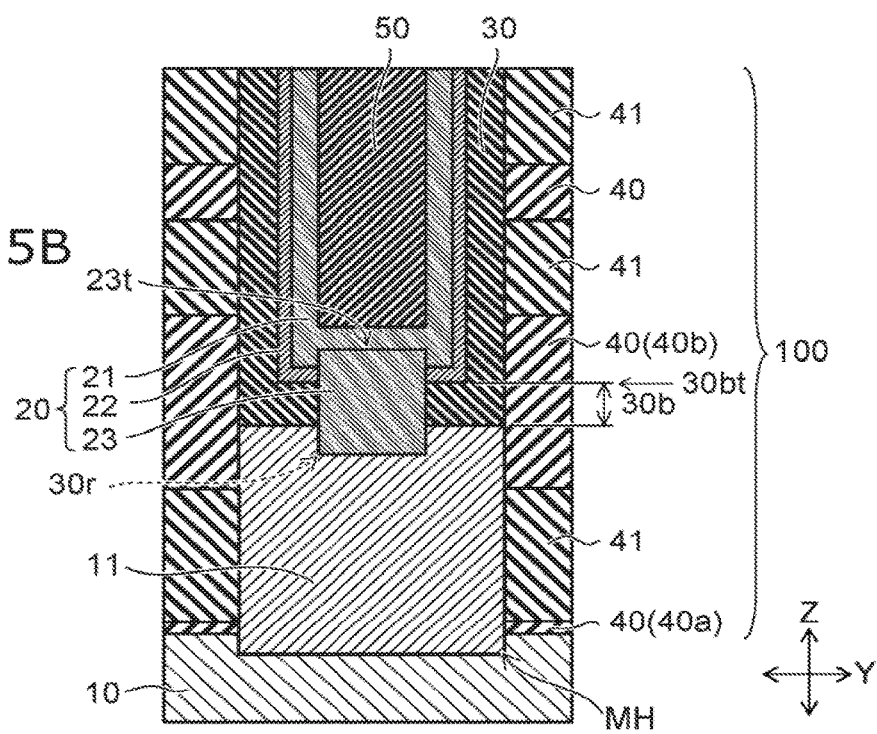

Next, as shown in FIG. 15B, the semiconductor film 20s and the cover portion 22s are annealed. Thereby, the channel portion 21 crystallized and the cover portion 22 crystallized are formed. The channel portion 21 and the cover portion 22 have a crystalline structure different from the lower end portion 23 of the semiconductor body 20, for example, have poly crystalline structure. At this time, the lower end portion 23 of the semiconductor body 20 has an interface between the channel portion 21 and the lower end portion 23, and between the cover portion 22 and the lower end portion 23.

<Forming the Core Layer 50>

After that, the core layer 50 is formed on the channel portion 21. The lower surface of the core layer 50 is in contact with the channel portion 21, and separated from the lower end portion 23 of the semiconductor body 20.

<Forming the Electrode Layer (SGS, WL, SGD) to Forming the Bit Line BL>

After that, for example, by the similar process to a detail described with reference to FIG. 9A, FIG. 9B, FIG. 1, and FIG. 2, the semiconductor device of the third embodiment may be formed.

Here, before the process of forming the lower end portion 23 of the semiconductor body above describe, the cover film 36 may not be formed. In this case, vapor phase epitaxial growth method on condition that a growth rate of the film formed on the cover portion 22s is lower than a growth rate of the film formed on the semiconductor pillar 11 is performed. Further, by etching the film formed on the cover portion 22s selectivity, the structure shown in FIG. 14B may be achieved.

Fourth Embodiment: Semiconductor Device

Figure 16:
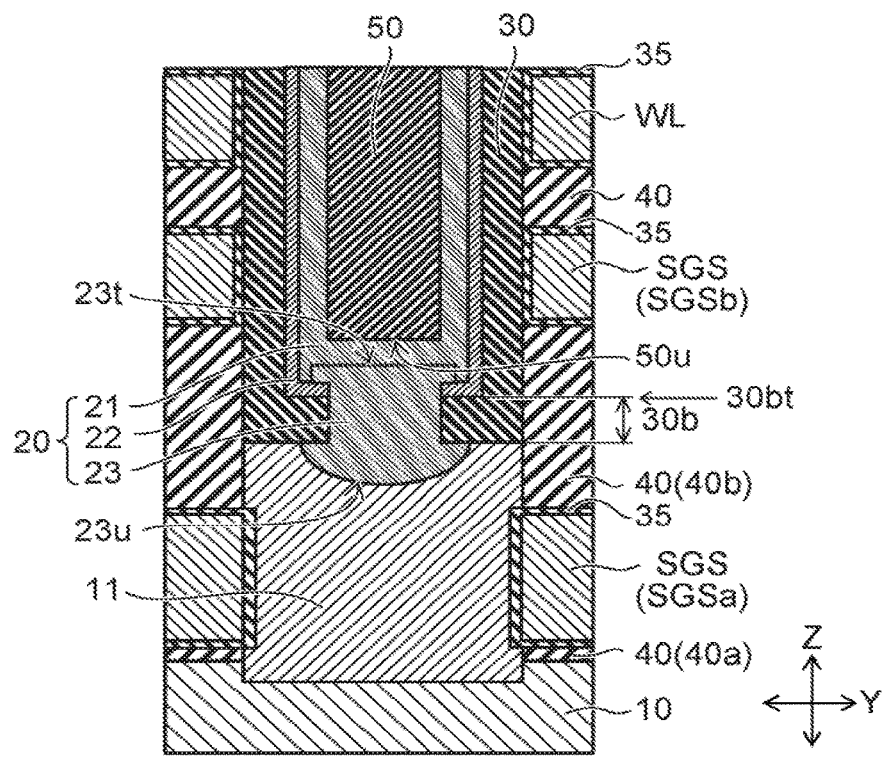
FIG. 16 is a schematic cross-sectional view of the semiconductor device of a fourth embodiment.

FIG. 16 is a schematic cross-sectional view of the semiconductor device of the fourth embodiment. A cross-section shown in FIG. 16 corresponds to the cross-section in FIG. 3B.

As shown in FIG. 16, the semiconductor device of the fourth embodiment is different from the semiconductor device of the third embodiment in that the lower end portion 23 of the semiconductor body 20 is provided in contact with the upper surface 30bt and the lower surface of the lower end portion 30b of the memory film 30.

Also in the fourth embodiment, the lower end portion 23 of the semiconductor body 20 is provided in the portion surrounded with the lower end portion 30b of the memory film 30. Thereby, the decreasing the cell current may be suppressed.

Further, in the fourth embodiment, as viewed from the Z-direction, the upper surface 23t of the lower end portion 23 of the semiconductor body 20 overlaps the lower end portion 30b of the memory film 30. At this time, the lower end portion 23 of the semiconductor body 20 provided in the portion on the lower end portion 30b of the memory film 30 is in contact with the channel portion 21. Thus, an area size of the lower end portion 23 of the semiconductor body 20 in contact with the channel portion 21 does not depend on the inner diameter of the lower end portion 30b of the memory film 30. Thereby, in case of reducing the inner diameter of the lower end portion 30b of the memory film 30 also, the increasing the contact resistance between the lower end portion 23 of the semiconductor body 20 and the channel portion 21 may be suppressed.

Further, in the fourth embodiment, as viewed from the Z-direction, the lower surface 23u of the lower end portion 23 of the semiconductor body 20 overlaps the lower end portion 30b of the memory film 30. Thus, the area size of the lower end portion 23 of the semiconductor body 20 in contact with the semiconductor pillar 11 does not depend on the inner diameter of the lower end portion 30b of the memory film 30. Thereby, in case of reducing the inner diameter of the lower end portion 30b of the memory film 30 also, the contact resistance between the semiconductor body 20 and the semiconductor pillar 11 may be reduced.

Fourth Embodiment: Manufacturing Method

Next, one example of a method of manufacturing the semiconductor device of the fourth embodiment will be described.

Figure 17A:
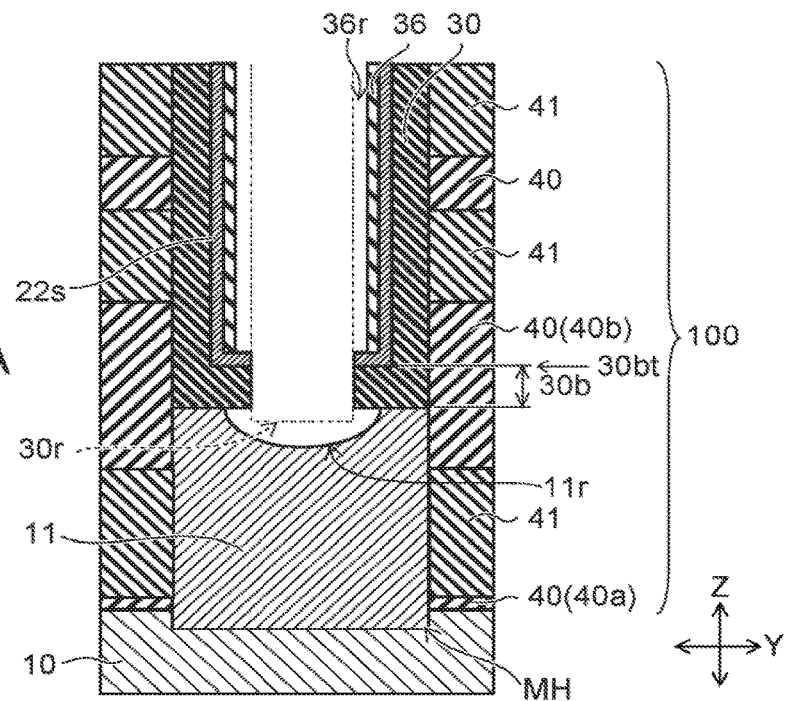
FIG. 17A and FIG. 17B are schematic cross-sectional views showing a method for manufacturing the semiconductor device of the fourth embodiment.
Figure 17B:
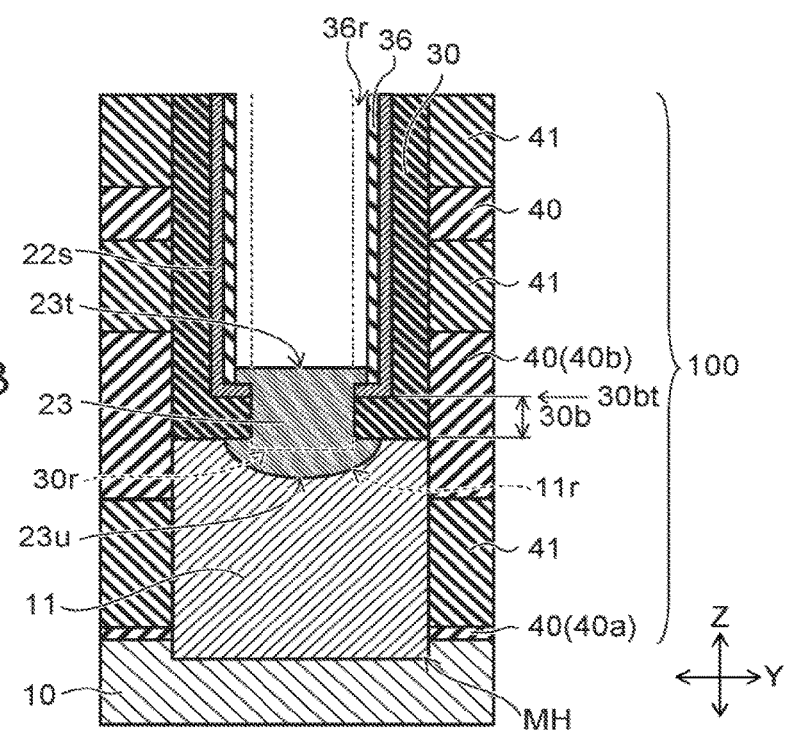

FIG. 17A and FIG. 17B are schematic cross-sectional views showing a method for manufacturing the semiconductor device of the fourth embodiment. Cross-sections shown in FIG. 17A and FIG. 17B correspond to the cross-section in FIG. 3B.

<Forming the Stacked Body 100 to Forming the Recess Portion 30r>

For example, according to the manufacturing method described with reference to FIG. 4A to FIG. 5A, FIG. 13A, and FIG. 13B, the forming of the stacked body 100 to the forming of the recess portion 30r shown in FIG. 17A are performed.

<Forming the Recess Portions 11r, 36r>

As shown in FIG. 17A, the semiconductor pillar 11 and the cover film 36 are recessed, and the recess portions 11r, 36r are formed. A broken line portion in the figure shows the surface of the semiconductor pillar 11 (side wall of the recess portion 30r) and the surface of the cover film 36 before recessing. An isotropic etching is used as a method of recessing the semiconductor pillar 11 and the cover film 36. The isotropic etching is, for example, a wet etching using dilute hydrofluoric acid. Thus, the cover film 36 and the semiconductor pillar 11 are uniformly recessed from the surface where the cover film 36 and the semiconductor pillar 11 is exposed from the space of the hole MH. The isotropic etching is, for example, at least performed until a portion of the lower end portion 30b of the memory film 30 is exposed from the recess portions 11r, 36r. Further, the isotropic etching is, for example, terminated before exposing the cover portion 22s from the recess portion 36r.

<Forming the Lower End Portion 23 of the Semiconductor Body>

Next, as shown in FIG. 17B, the lower end portion 23 of the semiconductor body is formed in each of the recess portions 11r, 30r, 36r. The upper surface 23t of the lower end portion 23 of the semiconductor body is formed continued from the upper surface of the semiconductor pillar 11 to a height being the height of the upper surface 30bt of the lower end portion 30b of the memory film 30 or more, the upper surface of the semiconductor pillar 11 is exposed from the recess portion 11r. The lower end portion 23 of the semiconductor body is, for example, formed using the vapor phase epitaxial growth formed from the upper surface of the semiconductor pillar 11. At this time, the area of the lower end portion 23 of the semiconductor body in contact with the semiconductor pillar 11 is large as compared with the case the recess portion 11r is not formed. Thereby, the contact resistance between the lower end portion 23 of the semiconductor body and the semiconductor pillar 11 may be reduced.

<Removing the Cover Film 36 to Forming the Core Layer 50>

After that, similar to a detail described with reference to FIG. 14B to FIG. 15B, the cover film 36 is removed, and the semiconductor film 20s is formed on the lower end portion 23 of the semiconductor body and the cover portion 22s. After that, for example, the semiconductor film 20s and the cover portion 22s is annealed. Thereby, as shown in FIG. 16, the channel portion 21 crystallized and the cover portion 22 crystallized are formed. At this time, the area of the lower end portion 23 of the semiconductor body 20 in contact with the channel portion 21 is large as compared with the case the recess portion 36r is not formed. Thereby, the contact resistance between the lower end portion 23 of the semiconductor body 20 and the channel portion 21 may be reduced. After that, the core layer 50 is formed on the channel portion 21.

<Forming the Electrode Layer (SGS, WL, SGD) to Forming the Bit Line BL and so On>

After that, for example, by the similar process to a detail described with reference to FIG. 9A, FIG. 9B, FIG. 1, and FIG. 2, the semiconductor device of the fourth embodiment may be formed.

Fifth Embodiment: Semiconductor Device

Figure 18:
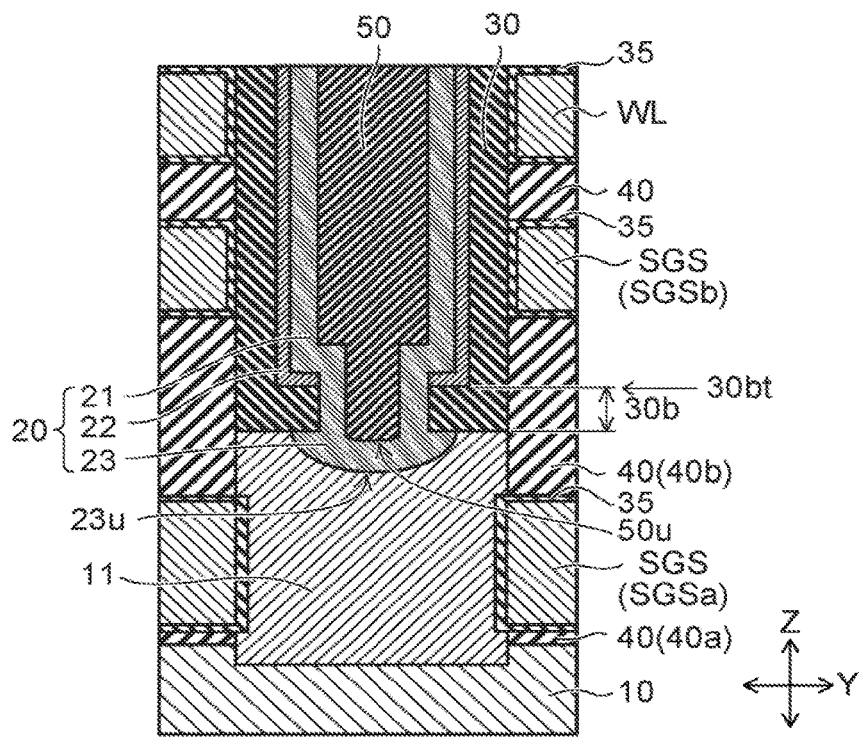
FIG. 18 is a schematic cross-sectional view of the semiconductor device of a fifth embodiment.

FIG. 18 is a schematic cross-sectional view of the semiconductor device of the fifth embodiment. A cross-section shown in FIG. 18 corresponds to the cross-section shown in FIG. 3B.

As shown in FIG. 18, the semiconductor device of the fifth embodiment is different from the semiconductor device of the third embodiment in that the lower end portion 23 of the semiconductor body 20 is provided below the lower end portion 30b of the memory film 30.

In the fifth embodiment, as viewed from the Z-direction, the lower surface 23u of the lower end portion 23 of the semiconductor body 20 overlaps the lower end portion 30b of the memory film 30. Thus, the area of the lower end portion 23 of the semiconductor body 20 in contact with the semiconductor pillar 11 does not depend on the inner diameter of the lower end portion 30b of the memory film 30. Thereby, in case of reducing the inner diameter of the lower end portion 30b of the memory film 30 also, the increasing the contact resistance between the semiconductor body 20 and the semiconductor pillar 11 may be suppressed.

Fifth Embodiment: Manufacturing Method

Next, one example of a method for manufacturing the semiconductor device of the fifth embodiment will be described.

Figure 19A:
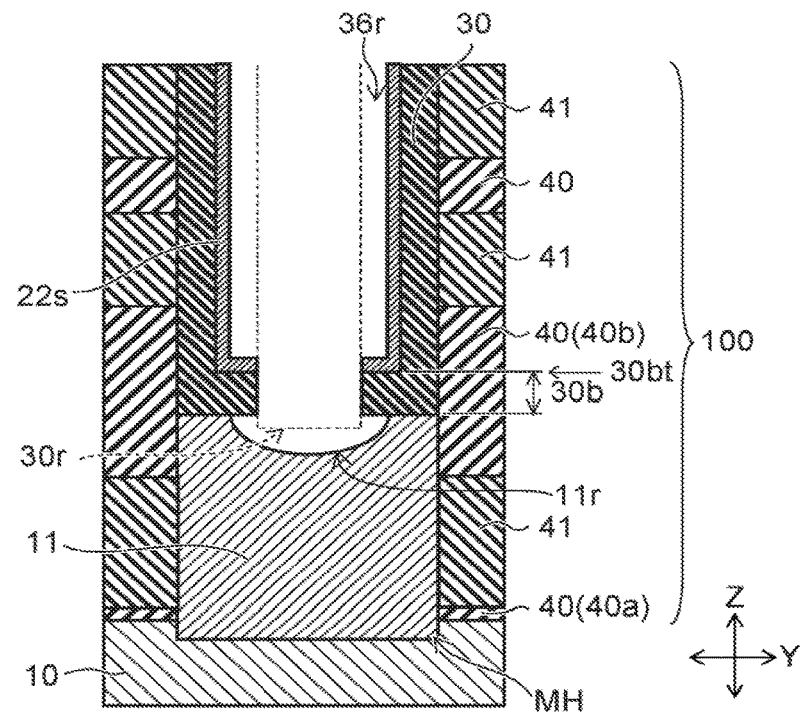
FIG. 19A and FIG. 19B are schematic cross-sectional views showing a method for manufacturing the semiconductor device of the fifth embodiment.
Figure 19B:
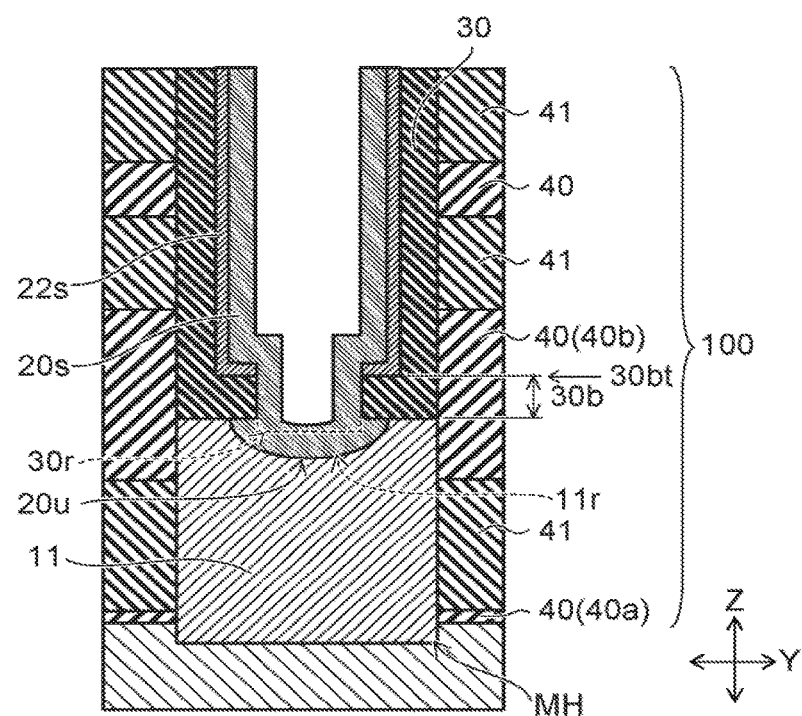

FIG. 19A and FIG. 19B are schematic cross-sectional views showing a method for manufacturing the semiconductor device of the fifth embodiment. Cross-sections shown in FIG. 19A and FIG. 19B correspond to the cross-section shown in FIG. 3B.

<Forming the Stacked Body 100 to Forming the Recess Portions 11r, 30r, 36r>

For example, according to the manufacturing method described with reference to FIG. 4A to FIG. 5A, FIG. 13A, FIG. 13B, and FIG. 17A, by forming the recess portions 11r, 36r, the structure shown in FIG. 19A is achieved. A broken line portion in the figure shows the surface of the semiconductor pillar 11 (side wall of the recess portion 30r) and the surface of the cover film 36 before recessing. In the fifth embodiment, the cover film 36 is entire removed. Thereby, the cover portion 22s is exposed from the recess portion 36r.

<Forming the Semiconductor Film 20s>

Next, as shown in FIG. 19B, the semiconductor film 20s is formed in each of the recess portions 11r, 30r, 36r. The semiconductor film 20s is formed from the upper surface of the semiconductor pillar 11 to the cover portion 22s.

<Crystallizing the Semiconductor Film 20s and the Cover Portion 22s>

After that, for example, the semiconductor film 20s and the cover portion 22s is annealed. Thereby, as shown in FIG. 18, the channel portion 21 crystallized, the lower end portion 23 of the semiconductor body 20 crystallized, and the cover portion 22 crystallized are formed. At this time, the area of the lower end portion 23 of the semiconductor body 20 in contact with the semiconductor pillar 11 is large as compared with the case the recess portion 11r is not formed. Thereby, the contact resistance between the semiconductor body 20 and the semiconductor pillar 11 may be reduced.

<Forming the Core Layer 50 to Forming the Bit Line BL and so On>

Next, by the similar process to a detail described with reference to FIG. 15B, the core layer 50 is formed on the channel portion 21. After that, for example, by the similar process to a detail described with reference to FIG. 9A, FIG. 9B, FIG. 1, and FIG. 2, the semiconductor device of the fifth embodiment may be formed.

Sixth Embodiment: Semiconductor Device

Figure 20:
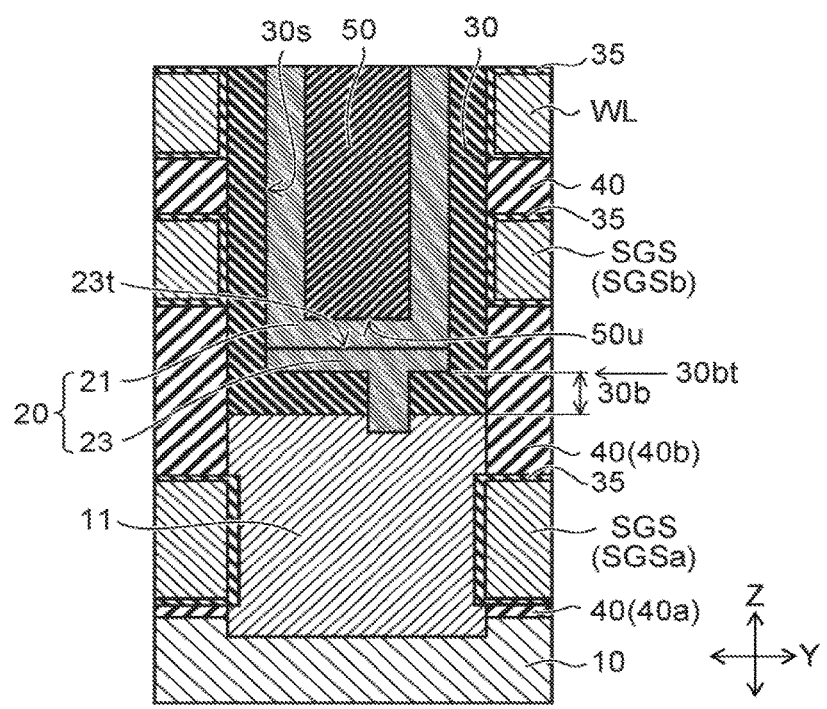
FIG. 20 is a schematic cross-sectional view of the semiconductor device of a sixth embodiment.

FIG. 20 is a schematic cross-sectional view of the semiconductor device of a sixth embodiment. A cross-section shown in FIG. 20 corresponds to the cross-section shown in FIG. 3B.

As shown in FIG. 20, the semiconductor device of the sixth embodiment is different from the semiconductor device of the third embodiment in that the cover portion 22 is not provided.

Also in the sixth embodiment, the lower end portion 30b of the semiconductor body 20 is provided in the portion surrounded with the lower end portion 30b of the memory film 30. Thereby, the decreasing the cell current may be suppressed.

Further, in the sixth embodiment, a side surface 30s of the memory film 30 is in contact with the channel portion 21 and the lower end portion 23 of the semiconductor body 20, the side surface 30s located above of the memory film 30 of the memory film 30. As viewed from the Z-direction, the diameter of the upper surface 23t of the lower end portion 23 of the semiconductor body 20 is equal to the diameter of the lower surface of the channel portion 21. Thus, the area of the lower end portion 23 of the semiconductor body 20 in contact with the channel portion 21 is large as compared with the case of forming the cover portion 22. Thereby, the contact resistance between the lower end portion 23 of the semiconductor body 20 and the channel portion 21 may be reduced.

Sixth Embodiment: Manufacturing Method

Next, one example of a method for manufacturing the semiconductor device of the sixth embodiment will be described.

FIG. 21A to FIG. 22B are schematic cross-sectional views showing a method for manufacturing the semiconductor device of the sixth embodiment. Cross-sections shown in FIG. 21A to FIG. 22B correspond to the cross-section shown in FIG. 3B.

<Forming the Stacked Body 100 to Forming the Cover Portion 22s>

Figure 21A:
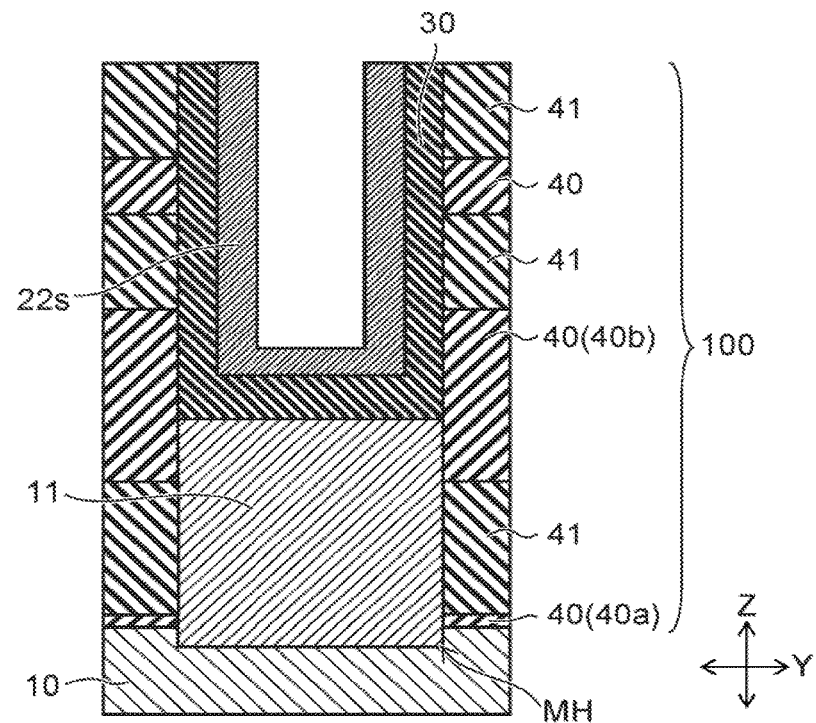
FIG. 21A to FIG. 22B are schematic cross-sectional views showing a method for manufacturing the semiconductor device of the sixth embodiment.

For example, according to the manufacturing method described with reference to FIG. 4A to FIG. 5A, the forming of the stacked body 100 to the forming of the semiconductor pillar 11 shown in FIG. 21A are performed. After forming the semiconductor pillar 11, by forming the memory film 30 on the inner wall of the hole MH and the upper surface of the semiconductor pillar 11 and forming cover portion 22s on the memory film 30, the structure shown in FIG. 21A is achieved.

<Forming the Recess Portion 30r>

Figure 21B:
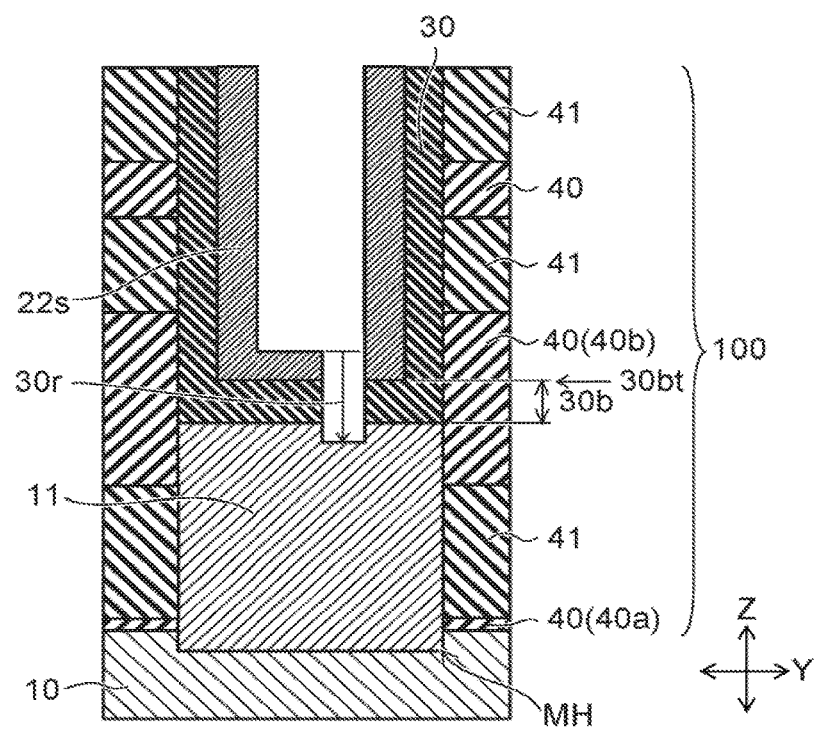

Next, as shown in FIG. 21B, the bottom portion of the cover portion 22s and the bottom portion of the memory film 30 are removed, and the recess portion 30r is formed. An arrow in the figure shows the recess portion 30r.

<Removing the Cover Portion 22s>

Figure 22A:
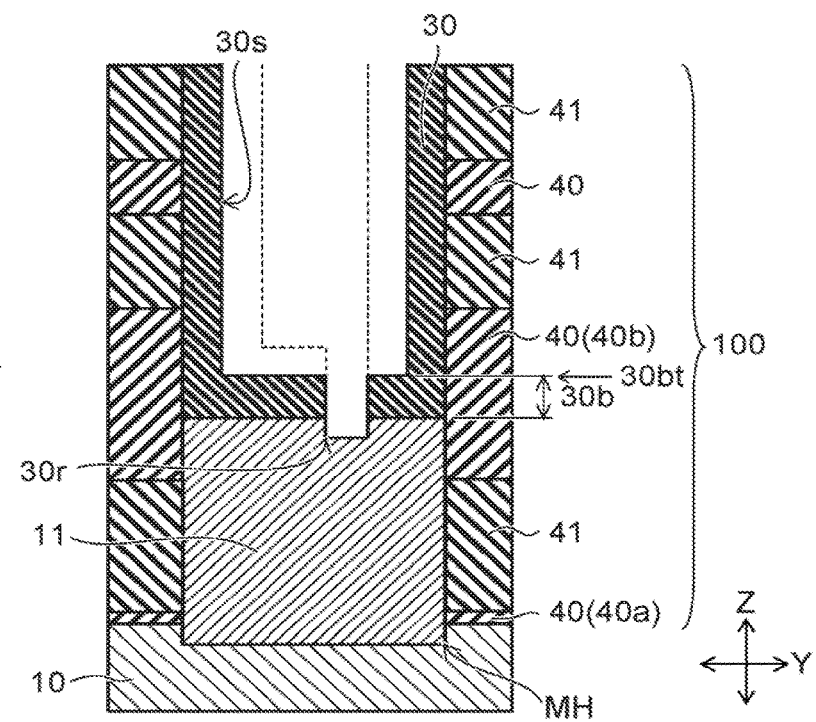

Next, as shown in FIG. 22A, the cover portion 22s is removed. A broken line in the figure shows the surface of the cover portion 22s before removed. Thereby, the side surface 30s of the memory film 30 and the upper surface of the lower end portion 30b are exposed from the space in the hole MH.

<Forming the Lower End Portion 23 of the Semiconductor Body>

Figure 22B:
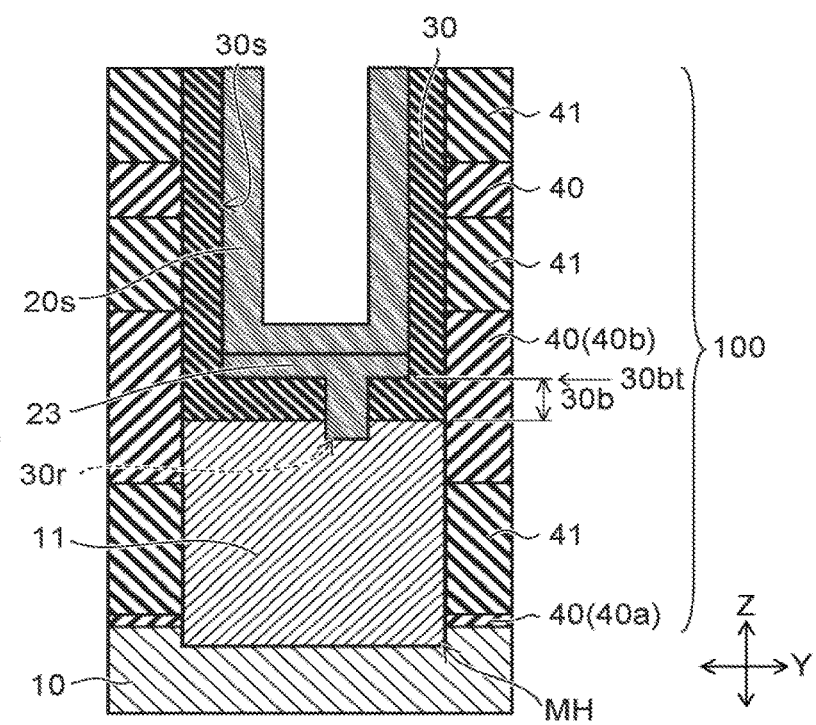

Next, as shown in FIG. 22B, the lower end portion 23 of the semiconductor body is formed in the recess portion 30r. The upper surface of the lower end portion 23 of the semiconductor body is formed continued from the upper surface of the semiconductor pillar 11 to the height being the height of the upper surface 30bt of the lower end portion 30b of the memory film 30 or more, the upper surface of the semiconductor pillar 11 is exposed from the recess portion 30r. At this time, the side surface 30s of the memory film 30 is in contact with the lower end portion 23 of the semiconductor body. The lower end portion 23 of the semiconductor body is, for example, formed using the vapor phase epitaxial growth formed from the upper surface of the semiconductor pillar 11.

<Forming the Semiconductor Film 20s to Crystallizing the Semiconductor Film 20s>

After that, the semiconductor film 20s is formed on the lower end portion 23 of the semiconductor body and the side surface 30s of the memory film 30. After that, for example, the semiconductor film 20s is annealed. Thereby, as shown in FIG. 20, the channel portion 21 crystallized is formed. At this time, the area of the lower end portion 23 of the semiconductor body 20 in contact with the channel portion 21 is large as compared with the case the cover portion 22s is not removed. Thereby, the contact resistance between the lower end portion 23 of the semiconductor body 20 and the channel portion 21 may be reduced.

<Forming the Core Layer 50 to Forming the Bit Line BL and so On>

Next, by the similar process to a detail described with reference to FIG. 15B, the core layer 50 is formed on the channel portion 21. After that, for example, by the similar process to a detail described with reference to FIG. 9A, FIG. 9B, FIG. 1, and FIG. 2, the semiconductor device of the sixth embodiment may be formed.

Seventh Embodiment: Semiconductor Device

Figure 23:
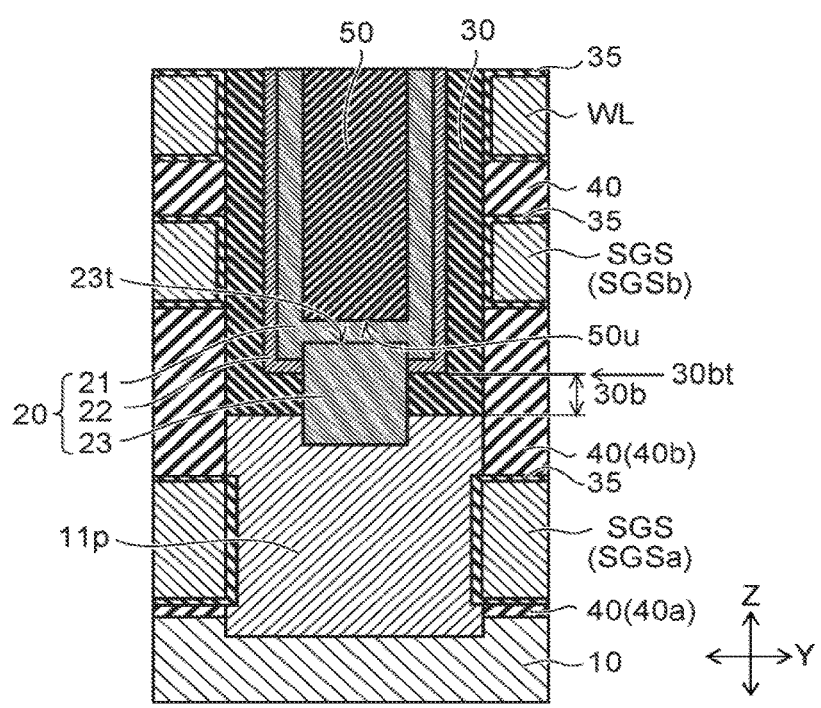
FIG. 23 is a schematic cross-sectional view of the semiconductor device of a seventh embodiment.

FIG. 23 is a schematic cross-sectional view of the semiconductor device of the seventh embodiment. A cross-section shown in FIG. 23 corresponds to the cross-section shown in FIG. 3B.

As shown in FIG. 23, the semiconductor device of the seventh embodiment is different from the semiconductor device of the third embodiment in that a P-type carrier concentration of the semiconductor pillar 11p is high.

Also in the seventh embodiment, the lower end portion 23 of the semiconductor body 20 is provided in the portion surrounded with the lower end portion 30b of the memory film 30. Thereby, the cell current may be increased.

Further, in the seventh embodiment, the semiconductor pillar 11p includes a P-type impurity. The P-type impurity is, for example, boron. A peak value of concentration of the boron (P-type carrier concentration) of the semiconductor pillar 11p is, for example, $1\times10^{18}$ cm$^{-3}$ or more. A P-type carrier concentration of the lower end portion 23 of the semiconductor body 20 is lower than the P-type carrier concentration of the semiconductor pillar 11p, for example, and is a finite value being $1\times10^{15}$ cm$^{-3}$ or less. Thereby, compared with the P-type carrier concentration of the semiconductor pillar 11p being equal to the P-type carrier concentration of the lower end portion 23 of the semiconductor body 20, a threshold voltage Vth of the select transistor STS may be increased. Therefore, an off-leak current of the select transistor STS may be reduced.

Further, in the seventh embodiment, the lower end portion 23 of the semiconductor body 20 may include, for example, an N-type (second conductivity type) impurity. The N-type impurity is, for example, arsenic. The concentration of the arsenic (N-type carrier concentration) of the lower end portion 23 of the semiconductor body 20 is higher than a N-type carrier concentration of the semiconductor pillar 11p, for example, and is higher than the finite value being $1\times10^{15}$ cm$^{-3}$ or less. Thus, an effective carrier concentration of the lower end portion 23 of the semiconductor body 20 may be expressed by the following equation:

the effective carrier concentration=the N-type carrier concentration−P-type carrier concentration.

At this time, the effective carrier concentration of the lower end portion 23 of the semiconductor body 20 is high as compared with an effective carrier concentration of the lower end portion 23 of the semiconductor body 20 in the case without including the N-type carrier concentration. Further, the lower end portion 23 of the semiconductor body 20 is provided on the drain side of the select transistor STS. Thereby, the select transistor STS having a drain resistance being low may be achieved. Here, at the erasing operation in the structure, a voltage applied to the second source-side select gate line SGSb is lower than a voltage applied to the first source-side select gate line SGSa. Thereby, the hole may be injected into the channel portion 21.

Seventh Embodiment: Manufacturing Method

Next, one example of a method of manufacturing the semiconductor device of the seventh embodiment will be described.

Figure 24A:
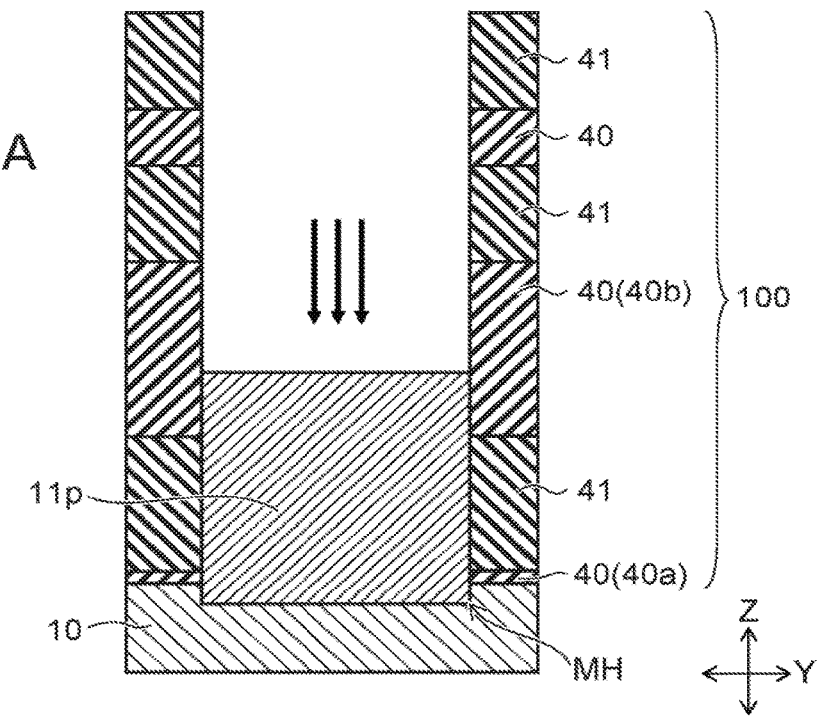
FIG. 24A and FIG. 24B are schematic cross-sectional views showing a method for manufacturing the semiconductor device of the seventh embodiment.
Figure 24B:
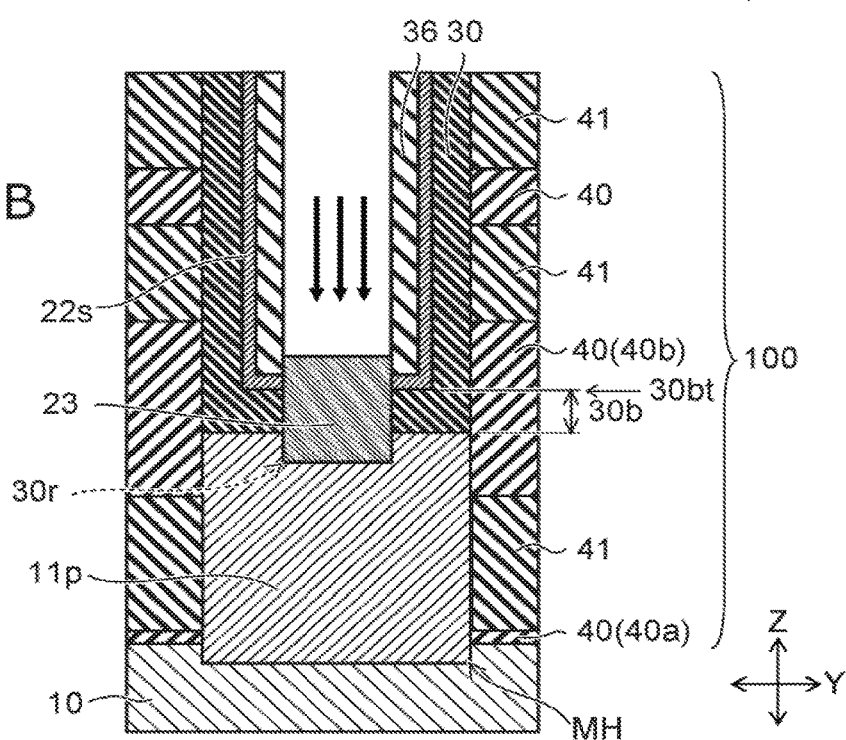

FIG. 24A and FIG. 24B are schematic cross-sectional views of the semiconductor device of the seventh embodiment. Cross-sections shown in FIG. 24A and FIG. 24B correspond to the cross-section shown in FIG. 3B.

<Forming the Stacked Body 100 and Forming the Hole MH>

For example, according to the manufacturing method described with reference to FIG. 4A and FIG. 4B, the forming of the stacked body 100 to the forming of the hole MH are performed.

<Forming the Semiconductor Pillar 11p>

After that, the semiconductor pillar 11p is formed in the hole MH. The semiconductor pillar 11p is, for example, formed using the vapor phase epitaxial growth formed from the upper surface of the substrate 10. After that, the P-type impurity is introduced in the semiconductor pillar 11p, and the structure shown in FIG. 24A is achieved. The P-type impurity is, for example, the boron. To introduce the boron, for example, ion implantation method is used. To introduce the boron, for example, diffusion method may be used. Thereby, the threshold voltage Vth of the select transistor STS may be increased.

<Forming the Memory Film 30 to Forming the Recess Portion 30r>

After that, for example, according to the manufacturing method described with reference to FIG. 13A and FIG. 13B, until the memory film 30, the cover portion 22s, the cover film 36, and the recess portion 30r shown in FIG. 24B are formed.

<Forming the Lower End Portion 23 of the Semiconductor Body>

After that, the lower end portion 23 of the semiconductor body is formed in the recess portion 30r, and the structure shown in FIG. 24B is achieved. The lower end portion 23 of the semiconductor body is, for example, formed using the vapor phase epitaxial growth formed from the upper surface of the semiconductor pillar 11. At this time, for example, the N-type impurity may be introduced into the lower end portion 23 of the semiconductor body. The N-type impurity is, for example, the arsenic. To introduce the arsenic, for example, ion implantation method is used. To introduce the arsenic, for example, diffusion method may be used. Thereby, the select transistor STS having a drain resistance being low may be achieved.

<Removing the Cover Film 36 to Forming the Core Layer 50>

After that, for example, similar to a detail described with reference to FIG. 14B to FIG. 15B, the cover film 36 is removed, and the semiconductor film 20s is formed on the lower end portion 23 of the semiconductor body and the cover portion 22s. After that, for example, the semiconductor film 20s and the cover portion 22s is annealed. Thereby, as shown in FIG. 23, the channel portion 21 crystallized and the cover portion 22 crystallized are formed. After that, the core layer 50 is formed on the channel portion 21.

<Forming the Electrode Layer (SGS, WL, SGD) to Forming the Bit Line BL and so On>

After that, for example, by the similar process to a detail described with reference to FIG. 9A, FIG. 9B, FIG. 1, and FIG. 2, the semiconductor device of the seventh embodiment may be formed. Here, the semiconductor device of the seventh embodiment may be used for the structures shown in FIG. 3B, FIG. 10, FIG. 16, and FIG. 20.

Thus, according to the embodiment, the decreasing the cell current with the reduction or increasing the number of stacks of the device may be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, comprising:
    forming a stacked body on a foundation member, the stacked body including the plurality of first layers stacked with an insulator interposed;
    forming a hole, the hole piercing the stacked body and reaching the foundation member;
    forming a semiconductor pillar on the foundation member exposed in the hole;
    forming an insulating film on an upper surface of the semiconductor pillar and on a side surface of the hole, the insulating film including a charge storage film;
    forming a first semiconductor portion on the insulating film;
    forming a recess portion reaching the semiconductor pillar by removing a bottom portion of the first semiconductor portion and a bottom portion of the insulating film; and
    forming a second semiconductor portion on the semiconductor pillar exposed from the recess portion, and forming a third semiconductor portion on the second semiconductor portion, an upper surface of the second semiconductor portion being disposed higher than an upper surface of a lower end portion of the insulating film, the lower end portion of the insulating film being formed on the upper surface of the semiconductor pillar,
    the forming of the second semiconductor portion and the third semiconductor portion including:
        forming a semiconductor film continued from on the semiconductor pillar exposed from the recess portion to on the first semiconductor portion,
        forming the second semiconductor portion by crystallizing a lower portion of the semiconductor film, the lower portion of the semiconductor film being disposed in the recess portion,
        recessing the upper surface of the second semiconductor portion and a side surface of an upper portion of the semiconductor film, the upper portion of the semiconductor film being disposed out of the recess portion, and
        forming the third semiconductor portion by annealing the upper portion of the semiconductor film;
    the crystallizing being performed by a solid phase epitaxial growth method.

2. The method according to claim 1, further comprising forming an insulating member on the third semiconductor portion, wherein
    the upper surface of the second semiconductor portion is located between the lower end portion of the insulating film and the insulating member.

3. The method according to claim 1, further comprising after the forming of the first semiconductor portion, forming a cover film on the first semiconductor portion, wherein
    the forming of the second semiconductor portion and the third semiconductor portion includes removing the cover film after the forming of the second semiconductor portion.

4. The method according to claim 1, wherein the second semiconductor portion is formed by a vapor phase epitaxial growth from an upper surface of the semiconductor pillar.

5. A method for manufacturing a semiconductor device, comprising:
    forming a stacked body on a foundation member, the stacked body including the plurality of first layers stacked with an insulator interposed;
    forming a hole, the hole piercing the stacked body and reaching the foundation member;
    forming a semiconductor pillar on the foundation member exposed in the hole;
    forming an insulating film on an upper surface of the semiconductor pillar and on a side surface of the hole, the insulating film including a charge storage film;
    forming a first semiconductor portion on the insulating film;
    forming a recess portion reaching the semiconductor pillar by removing a bottom portion of the first semiconductor portion and a bottom portion of the insulating film;
    forming a semiconductor film on an inner surface of the recess portion and on a side surface of the first semiconductor portion;
    forming a second semiconductor portion by crystallizing a lower portion of the semiconductor film;
    making the semiconductor film thinner; and
    forming a third semiconductor portion by annealing an upper portion of the semiconductor film.

6. A method for manufacturing a semiconductor device, comprising:

forming a stacked body on a foundation member, the stacked body including the plurality of first layers stacked with an insulator interposed;

forming a hole, the hole piercing the stacked body and reaching the foundation member;

forming a semiconductor pillar on the foundation member exposed in the hole;

forming an insulating film on an upper surface of the semiconductor pillar and on a side surface of the hole, the insulating film including a charge storage film;

forming a first semiconductor portion on the insulating film;

forming a recess portion reaching the semiconductor pillar by removing a bottom portion of the first semiconductor portion and a bottom portion of the insulating film;

forming a second semiconductor portion by epitaxial growth from the upper surface of the semiconductor pillar, wherein the epitaxial growth is a vapor phase epitaxial growth.

7. The method according to claim 6, further comprising:
forming a third semiconductor portion on the second semiconductor portion.

8. The method according to claim 6, wherein the forming the second semiconductor portion by epitaxial growth is from an underlying crystalline epitaxial structure.

* * * * *